US012765048B2

(12) United States Patent
Lin et al.

(10) Patent No.: US 12,765,048 B2
(45) Date of Patent: Oct. 13, 2026

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Cheng-I Lin, Hsinchu (TW); Shu-Han Chen, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 330 days.

(21) Appl. No.: 18/488,251

(22) Filed: Oct. 17, 2023

(65) Prior Publication Data

US 2025/0048725 A1 Feb. 6, 2025

Related U.S. Application Data

(60) Provisional application No. 63/530,116, filed on Aug. 1, 2023.

(51) Int. Cl.

| | |
|---|---|
| ***H10D 84/85*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(52) U.S. Cl.

CPC ........... *H10D 84/85* (2025.01); *H10D 30/014* (2025.01); *H10D 30/43* (2025.01); *H10D 30/6735* (2025.01); *H10D 30/6757* (2025.01); *H10D 62/121* (2025.01); *H10D 64/017* (2025.01); *H10D 84/0167* (2025.01); *H10D 84/038* (2025.01)

(58) Field of Classification Search

CPC . H10D 30/6735; H10D 30/0193; H10D 84/85

See application file for complete search history.

(56) References Cited

U.S. PATENT DOCUMENTS

| | | | |
|---|---|---|---|
| 9,209,247 | B2 | 12/2015 | Colinge et al. |
| 9,236,267 | B2 | 1/2016 | De et al. |
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |

(Continued)

*Primary Examiner* — Yu-Hsi D Sun

(74) *Attorney, Agent, or Firm* — NZ Carr Law Office

(57) ABSTRACT

A semiconductor device structure and methods of forming the same are described. The structure includes a first semiconductor layer disposed over a substrate, the first semiconductor layer has an edge portion and a center portion, and a height of the center portion is substantially greater than a height of the edge portion. The structure further includes a dielectric spacer disposed below and in contact with the edge portion of the first semiconductor layer, a gate dielectric layer surrounding the center portion of the first semiconductor layer, and a gate electrode layer disposed on the gate dielectric layer surrounding the center portion of the first semiconductor layer.

20 Claims, 32 Drawing Sheets

(56) References Cited

U.S. PATENT DOCUMENTS

| | | | |
|---|---|---|---|
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 11,557,659 | B2 | 1/2023 | Wang et al. |
| 11,581,415 | B2 | 2/2023 | Chen et al. |
| 2018/0061944 | A1* | 3/2018 | Cheng .................. H10D 62/118 |
| 2026/0006912 | A1* | 1/2026 | Mangu ............... H10D 84/0167 |

* cited by examiner

SEMICONDUCTOR DEVICE STRUCTURE AND METHODS OF FORMING THE SAME

CROSS-REFERENCE TO RELATED APPLICATIONS

This application claims priority to US Provisional Application Ser. No. 63/530,116 filed on Aug. 1, 2023, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down presents new challenge.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel are surrounded by the gate electrode, which allows for fuller depletion in the channel and results in less short-channel effects and better gate control. As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 8A-13A are cross-sectional side views of various stages of manufacturing the semiconductor device structure taken along cross-section A-A of FIG. 6, in accordance with some embodiments.

FIGS. 8B-13B are cross-sectional side views of various stages of manufacturing the semiconductor device structure taken along cross-section B-B of FIG. 6, in accordance with some embodiments.

FIGS. 8C-13C are cross-sectional side views of various stages of manufacturing the semiconductor device structure taken along cross-section C-C of FIG. 6, in accordance with some embodiments.

DETAILED DESCRIPTION

Figure 1:
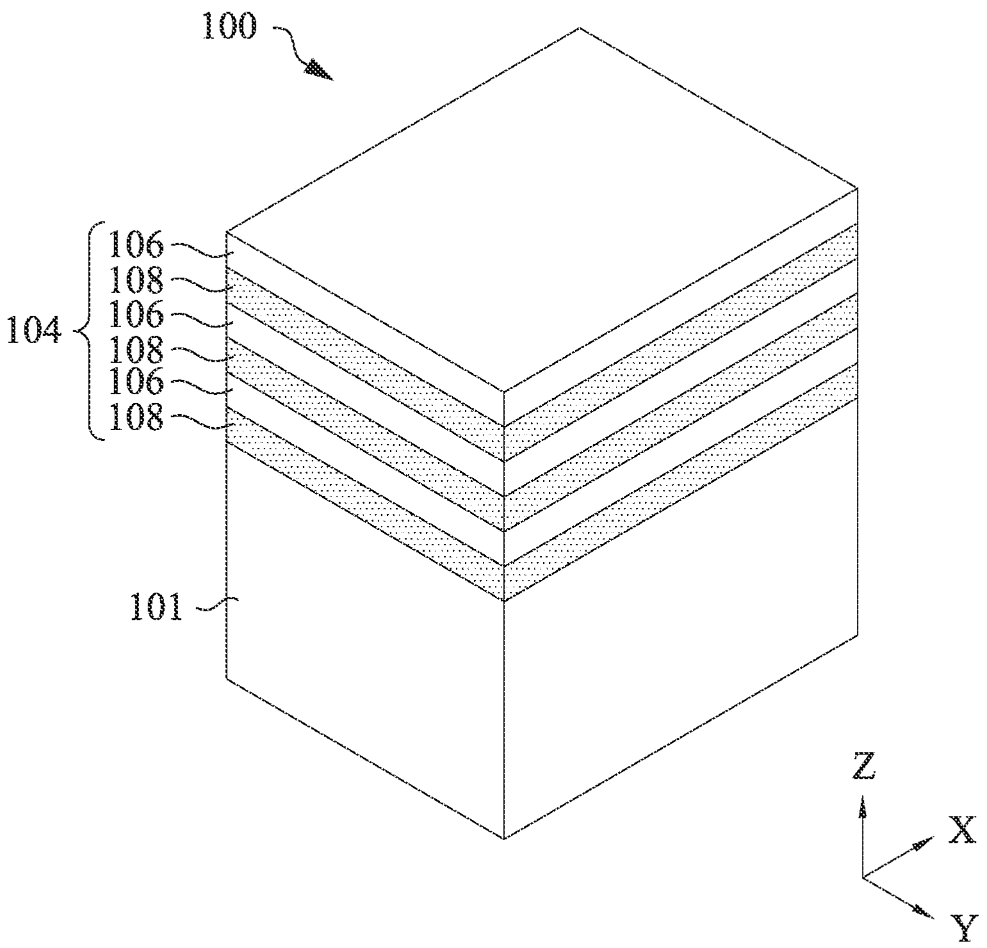
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, such as gate all around (GAA) FETs, for example Horizontal Gate All Around (HGAA) FETs or Vertical Gate All Around (VGAA) FETs, implementations of some aspects of the present disclosure may be used in other processes and/or in other devices, such as planar FETs, Fin-FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1-25D show exemplary processes for manufacturing a semiconductor device structure 100 according to embodiments of the present disclosure. It is understood that additional operations can be provided before, during, and after processes shown by FIGS. 1-25D, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In some embodiments, the substrate 101 is a silicon-on-insulator (SOI) substrate having an insulating layer (not shown) disposed between two silicon layers for enhancement. In one aspect, the insulating layer is an oxygen-containing layer.

The substrate 101 may include various regions that have been doped with impurities (e.g., dopants having P-type or N-type conductivity). Depending on circuit design, the dopants may be, for example boron for a P-type field effect transistors (PFET) and phosphorus for an N-type field effect transistors (NFET).

The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanosheet or nanostructure channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
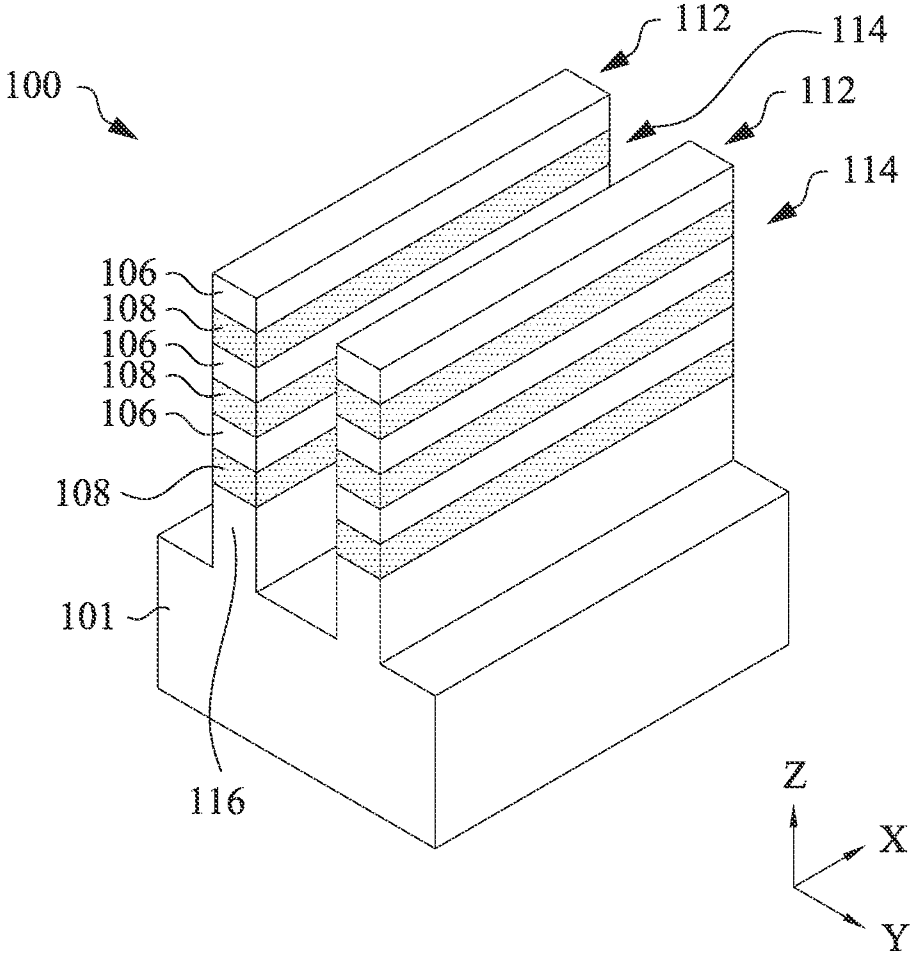

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photolithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
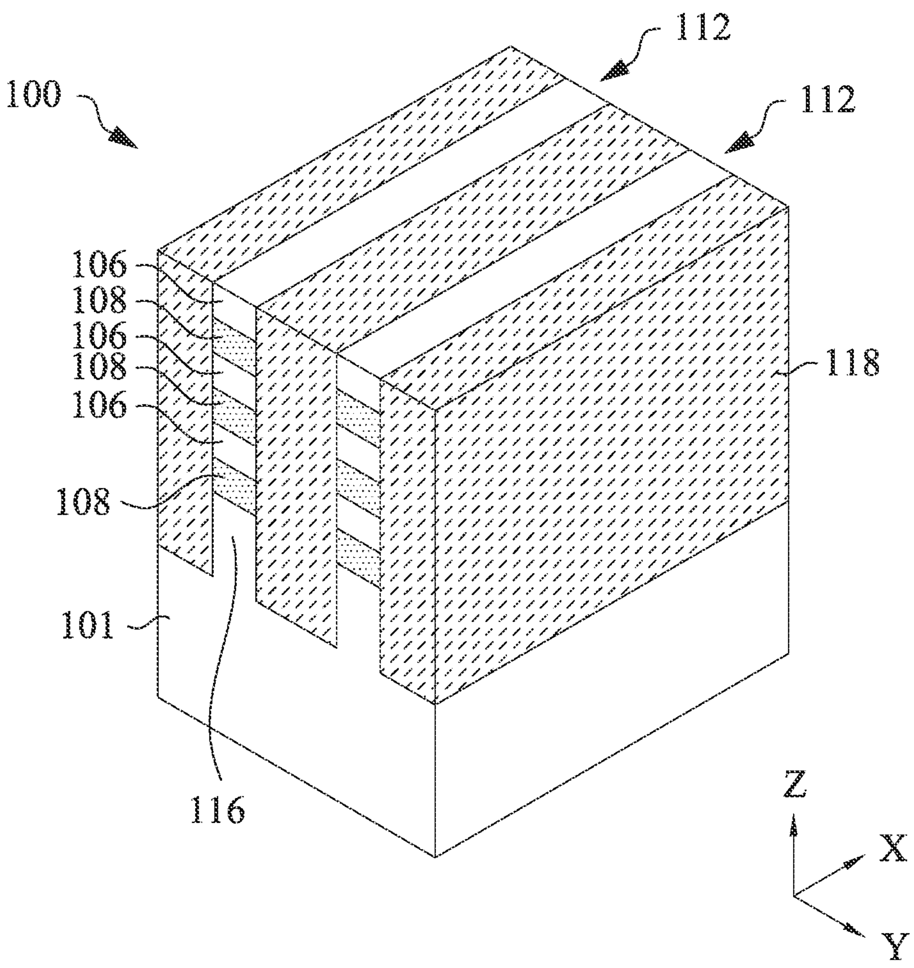

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SION), SiOCN, SiCN, fluorinedoped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
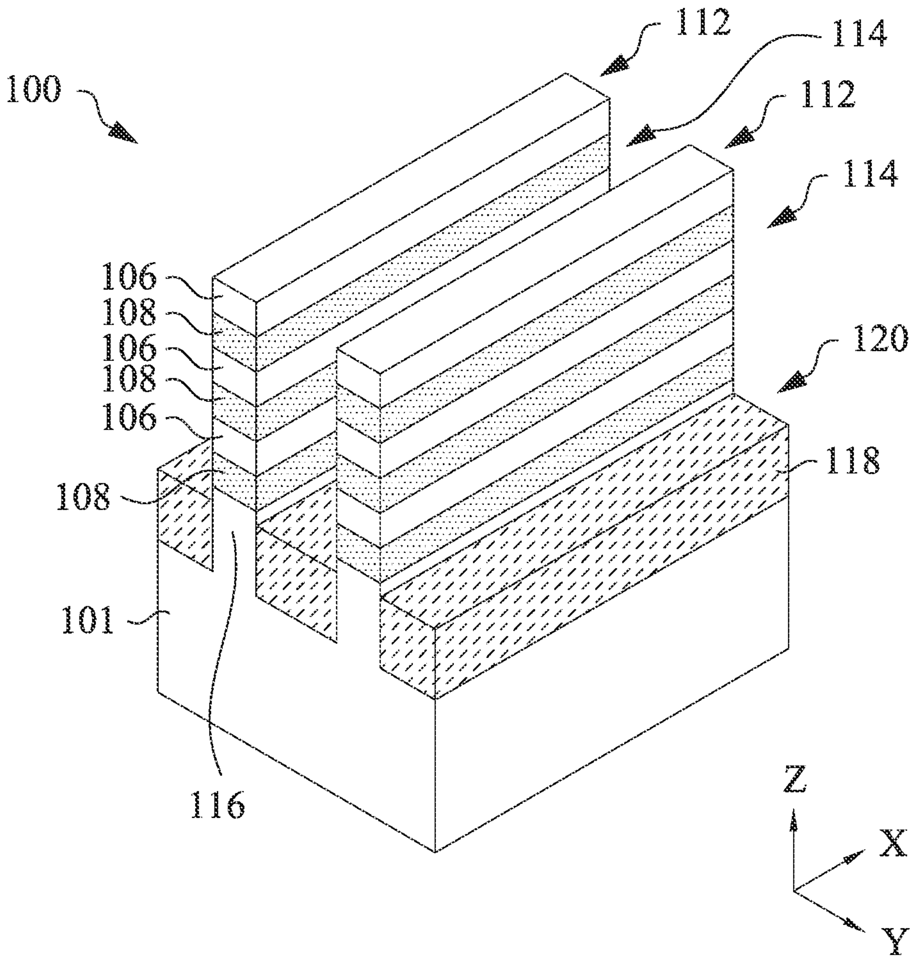

In FIG. 4, the insulating material 118 is recessed to form an isolation region 120. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or below a surface of the second semiconductor layers 108 in contact with the well portion 116 formed from the substrate 101.

Figure 5:
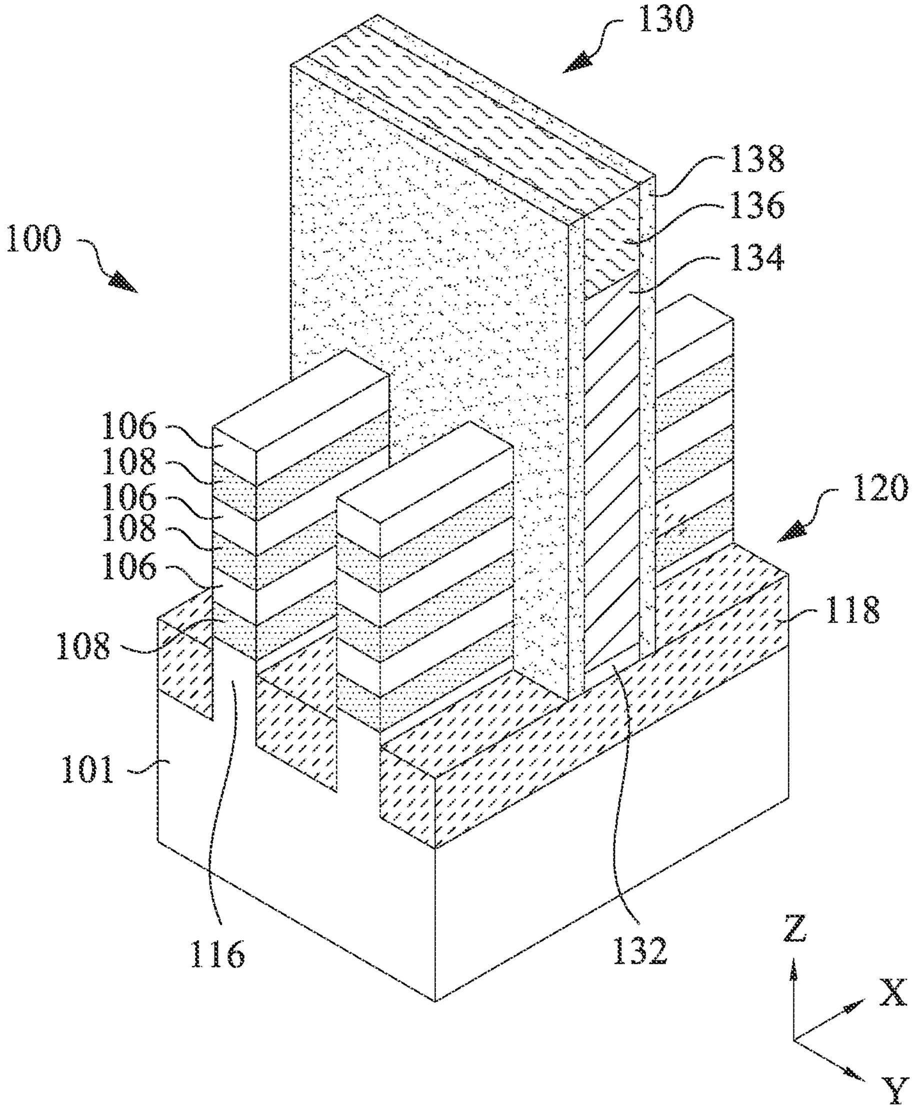

In FIG. 5, one or more sacrificial gate structures 130 are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. In some embodiments, the gate spacers 138 are also formed on sidewalls of the exposed portions of the fin structures 112. While one sacrificial gate structure 130 is shown, two or more sacrificial gate structures 130 may be arranged along the X direction in some embodiments.

The sacrificial gate dielectric layer 132 may include one or more layers of dielectric material, such as a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100.

Figure 6:
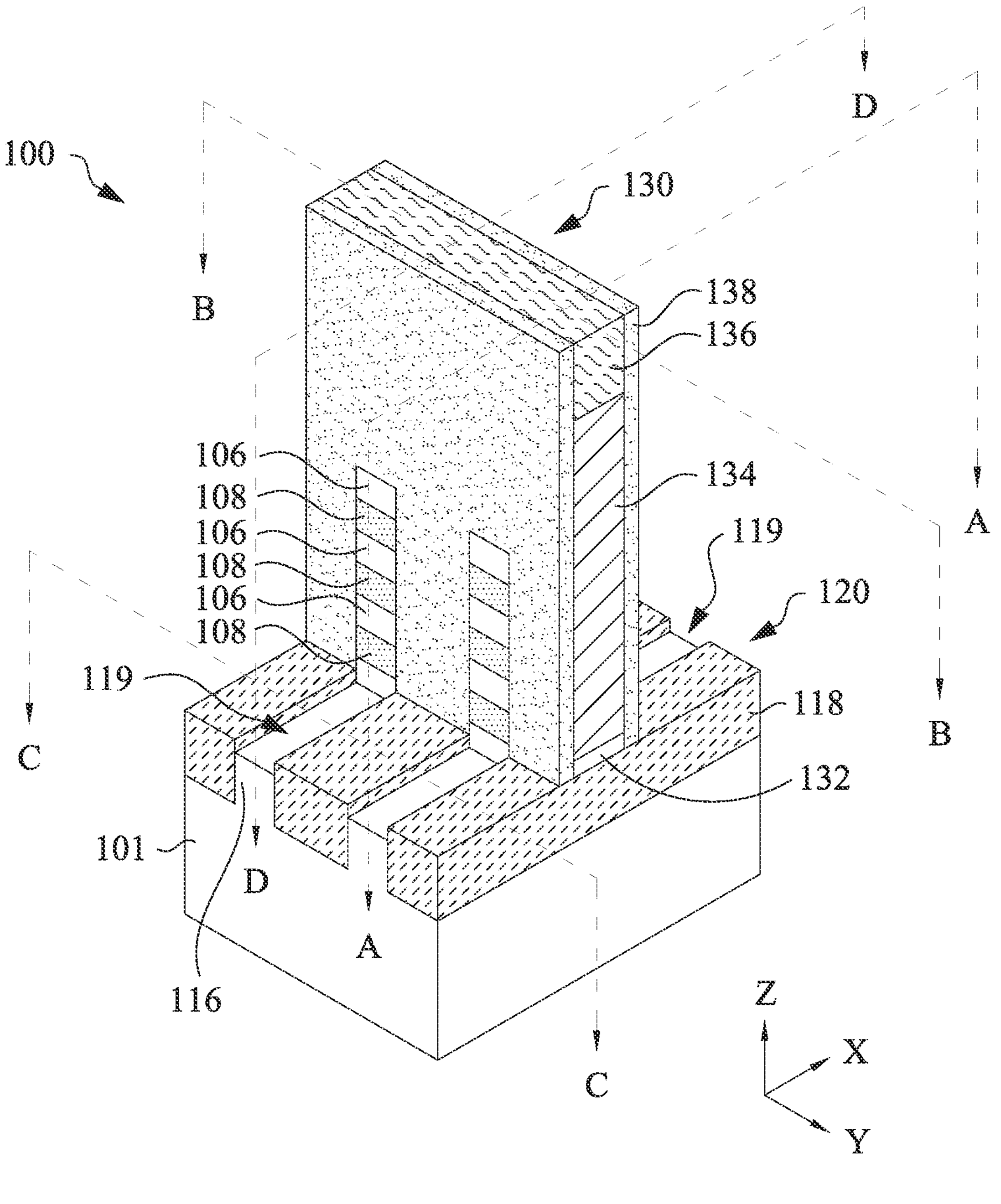

In FIG. 6, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130. The recess of the portions of the fin structures 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethylammonium hydroxide (TMAH), ammonium hydroxide ($NH_4OH$), or any suitable etchant. Trenches 119 are formed in the S/D regions as the result of the recess of the portions of the fin structures 112.

Figure 7B:
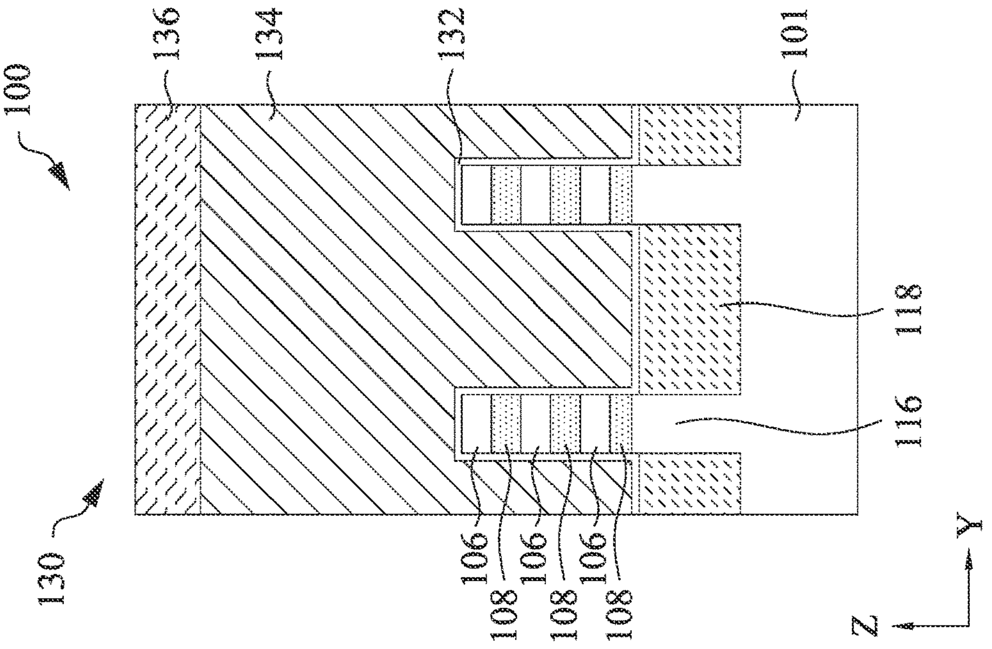
FIGS. 7A, 7B, and 7C are cross-sectional side views of the semiconductor device structure taken along line A-A, line B-B, and line C-C of FIG. 6, respectively.
Figure 7A:
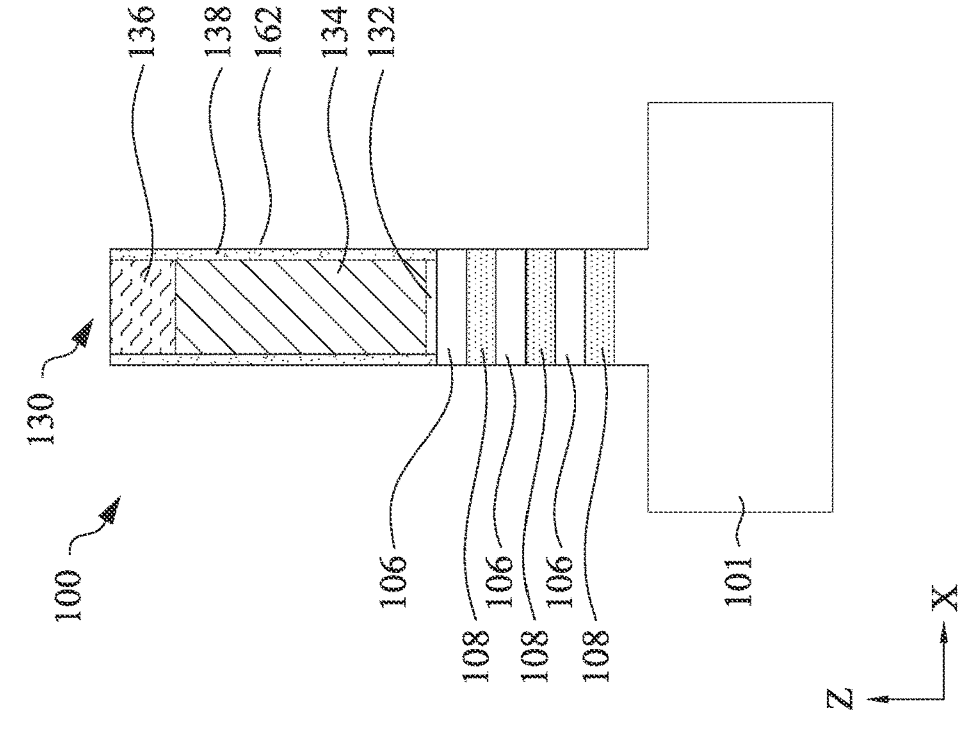
Figure 7C:
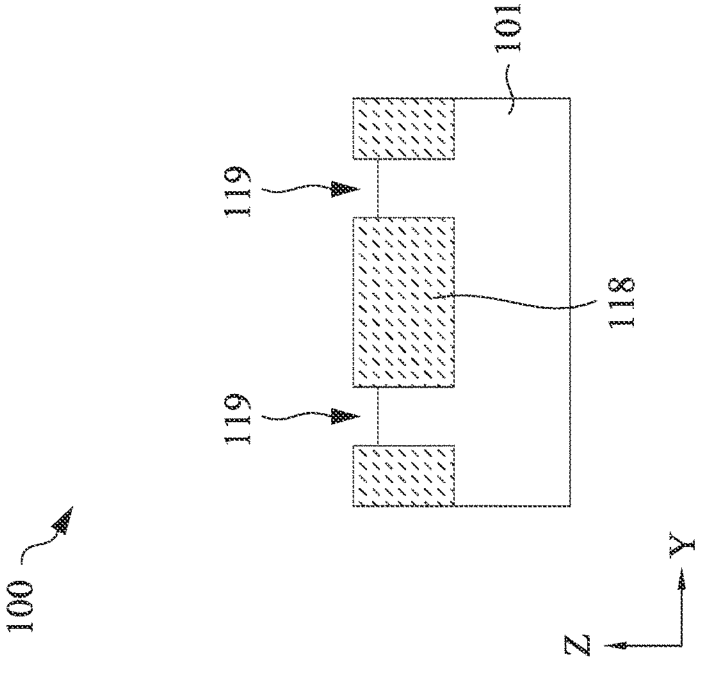

FIGS. 7A, 7B, and 7C are cross-sectional side views of the semiconductor device structure 100 taken along line A-A, line B-B, and line C-C of FIG. 6, respectively. FIGS. 8A-13A are cross-sectional side views of various stages of manufacturing the semiconductor device structure 100 taken along cross-section A-A of FIG. 6, in accordance with some embodiments. FIGS. 8B-13B are cross-sectional side views of various stages of manufacturing the semiconductor device structure 100 taken along cross-section B-B of FIG. 6, in accordance with some embodiments. FIGS. 8C-13C are cross-sectional side views of various stages of manufacturing the semiconductor device structure 100 taken along cross-section C-C of FIG. 6, in accordance with some embodiments. Cross-section A-A is in a plane of the fin structure 112 along the X direction. Cross-section B-B is in a plane perpendicular to cross-section A-A and is in the sacrificial gate structure 130. Cross-section C-C is in a plane perpendicular to cross-section A-A and is in the source/drain region (e.g., epitaxial S/D features 146 shown in FIG. 9A) along the Y-direction.

Figure 8A:
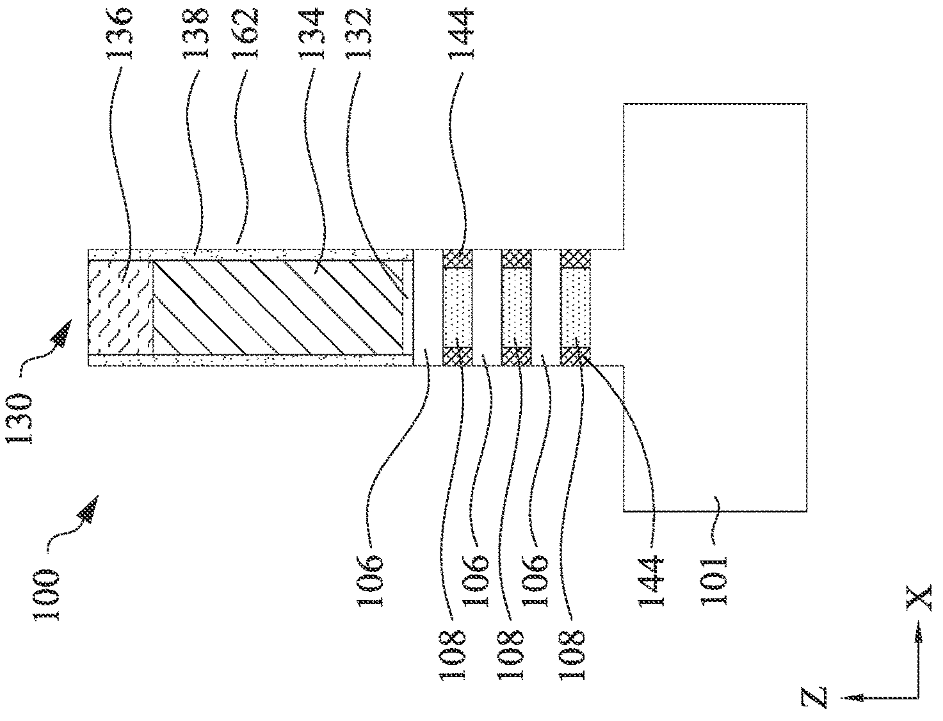
Figure 8B:
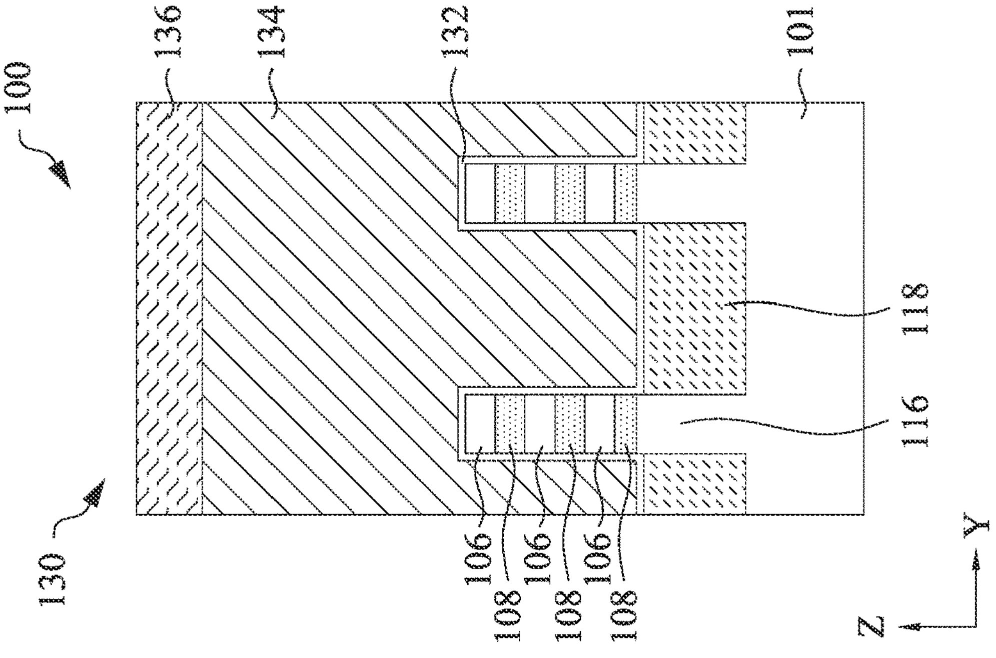
Figure 8C:
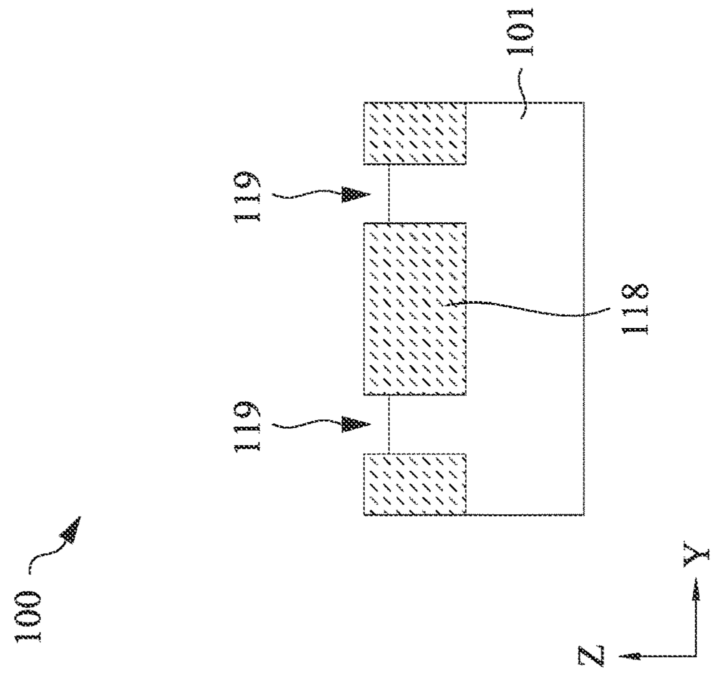

In FIGS. 8A-8C, edge portions of each second semiconductor layer 108 of the stack of semiconductor layers 104 are removed horizontally along the X direction. The removal of the edge portions of the second semiconductor layers 108 forms cavities. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions.

After removing edge portions of each second semiconductor layers 108, a dielectric layer is deposited in the cavities to form dielectric spacers 144. The dielectric spacers 144 may be made of a low-K dielectric material, such as SiON, SiCN, SiOC, SiOCN, or SiN. The dielectric spacers 144 may be formed by first forming a conformal dielectric layer using a conformal deposition process, such as ALD, followed by an anisotropic etching to remove portions of the conformal dielectric layer other than the dielectric spacers 144. The dielectric spacers 144 are protected by the first semiconductor layers 106 during the anisotropic etching process. The remaining second semiconductor layers 108 are capped between the dielectric spacers 144 along the X direction.

Figure 9B:
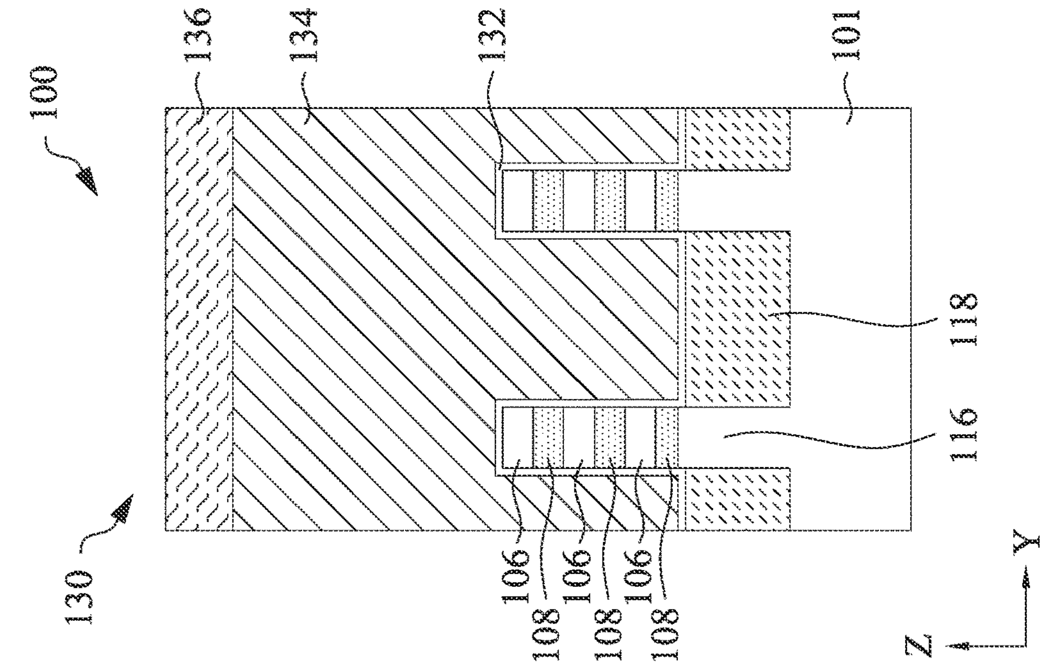
Figure 9A:
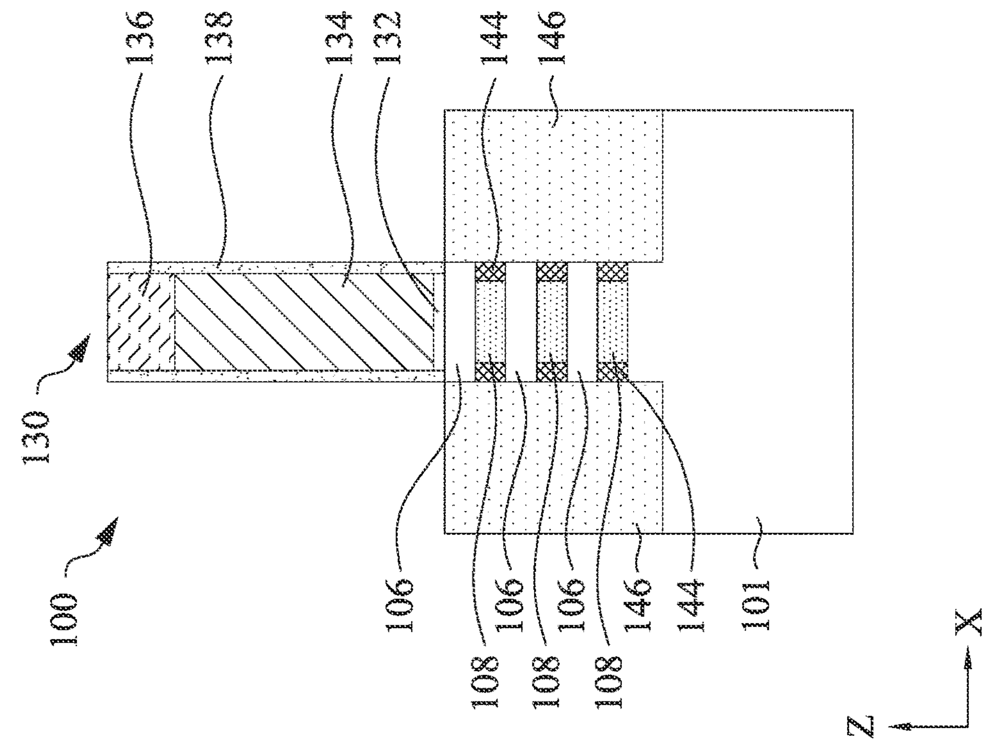
Figure 9C:
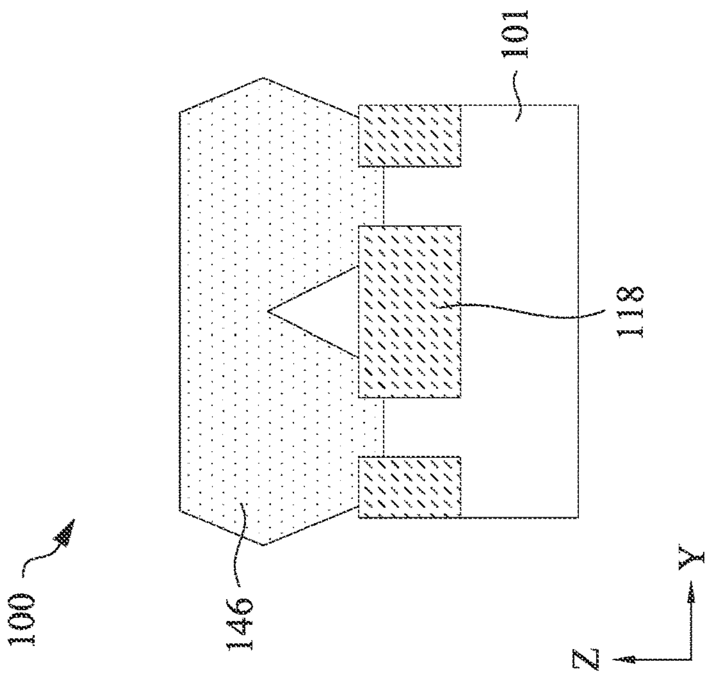

In FIGS. 9A-9C, epitaxial source/drain (S/D) features 146 are formed in the S/D regions. In this disclosure, a source features and a drain features are interchangeably used, and the structures thereof are substantially the same. Furthermore, source/drain features(s) may refer to a source or a drain, individually or collectively dependent upon the context. The epitaxial S/D features 146 may be made of one or more layers of Si, SiP, SiC and SiCP for n-channel FETs or Si, SiGe, Ge for p-channel FETs. For p-channel FETs, p-type dopants, such as boron (B), may also be included in the epitaxial S/D features 146. The epitaxial S/D features 146 may be formed by an epitaxial growth method using CVD, ALD or MBE.

The epitaxial S/D features 146 may grow both vertically and horizontally to form facets, which may correspond to crystalline planes of the material used for the substrate 101.

In some cases, the epitaxial S/D features 146 of a fin structure may grow and merge with the epitaxial S/D features 146 of the neighboring fin structures, as one example shown in FIG. 9C.

Figure 10A:
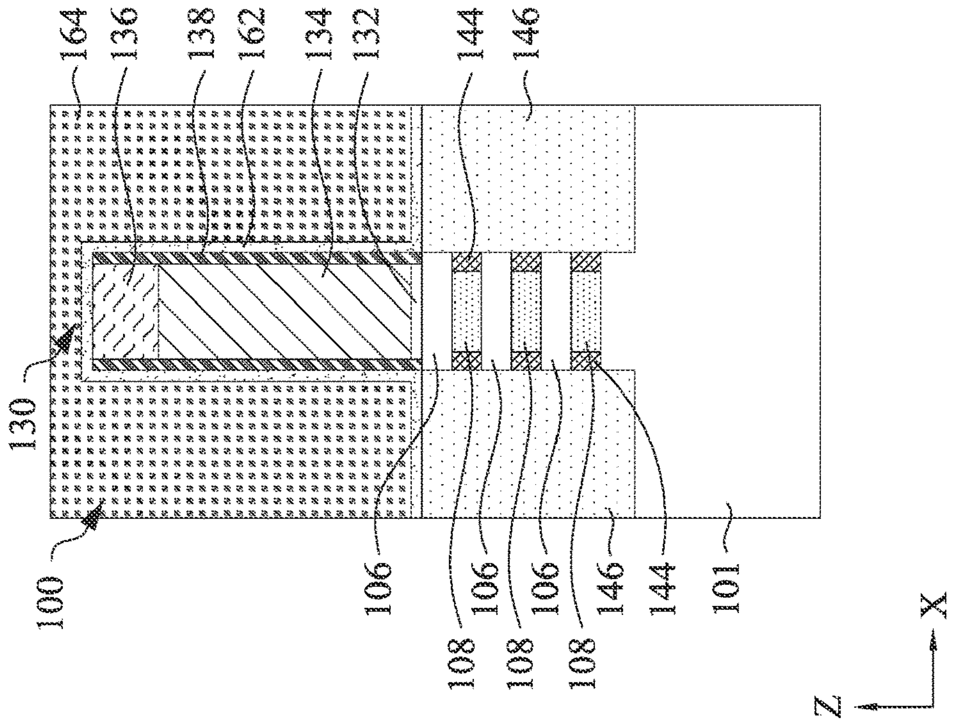
Figure 10C:
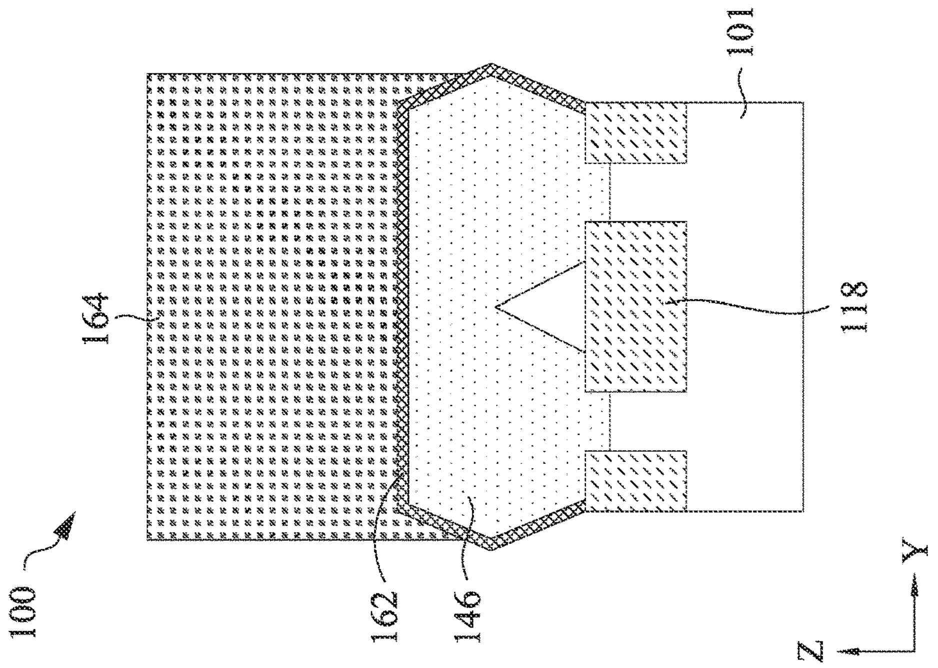
Figure 10B:
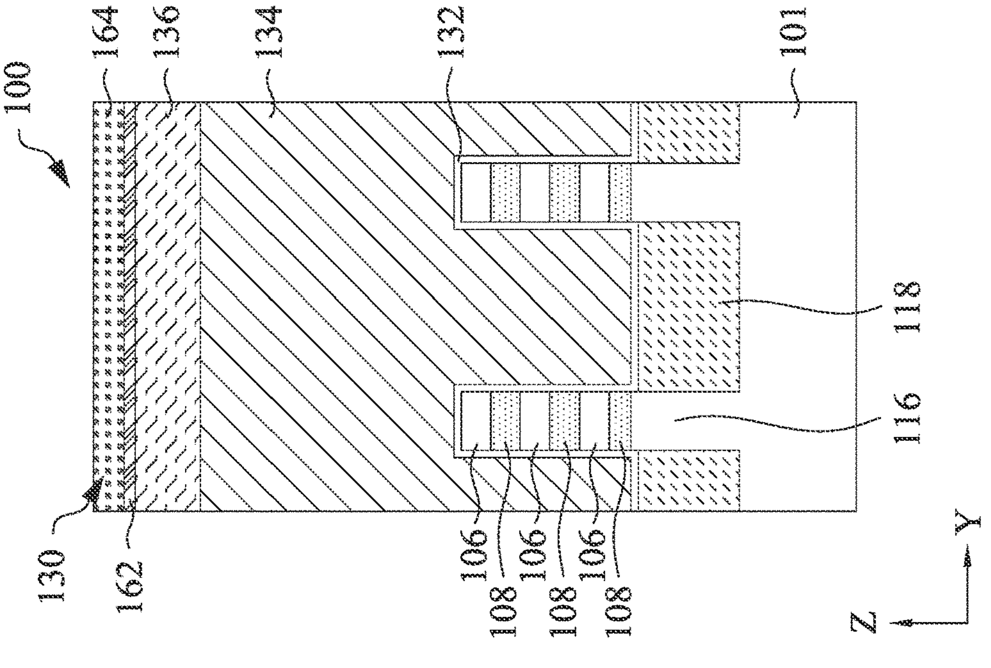

In FIGS. 10A-10C, a contact etch stop layer (CESL) 162 is conformally formed on the exposed surfaces of the semiconductor device structure 100. The CESL 162 covers the sidewalls of the sacrificial gate structure 130, the insulating material 118, and the epitaxial S/D features 146. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, an interlayer dielectric (ILD) layer 164 is formed on the CESL 162 over the semiconductor device structure 100. The materials for the ILD layer 164 may include compounds comprising Si, O, C, and/or H, such as silicon oxide, SiCOH and SiOC. Organic materials, such as polymers, may also be used for the ILD layer 164. The ILD layer 164 may be deposited by a PECVD process or other suitable deposition technique. In some embodiments, after formation of the ILD layer 164, the semiconductor device structure 100 may be subject to a thermal process to anneal the ILD layer 164.

Figure 11B:
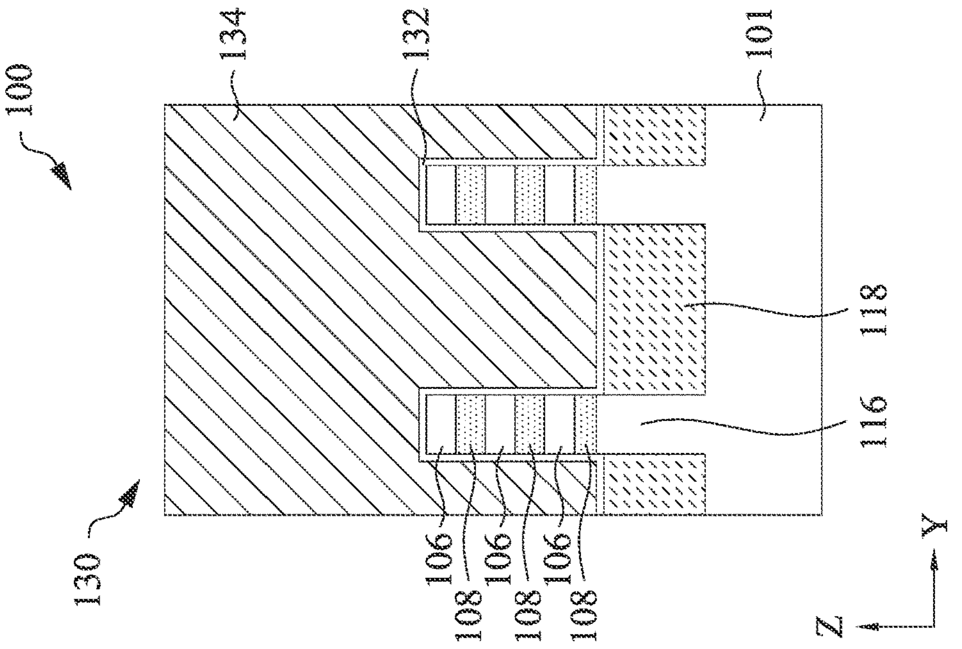
Figure 11A:
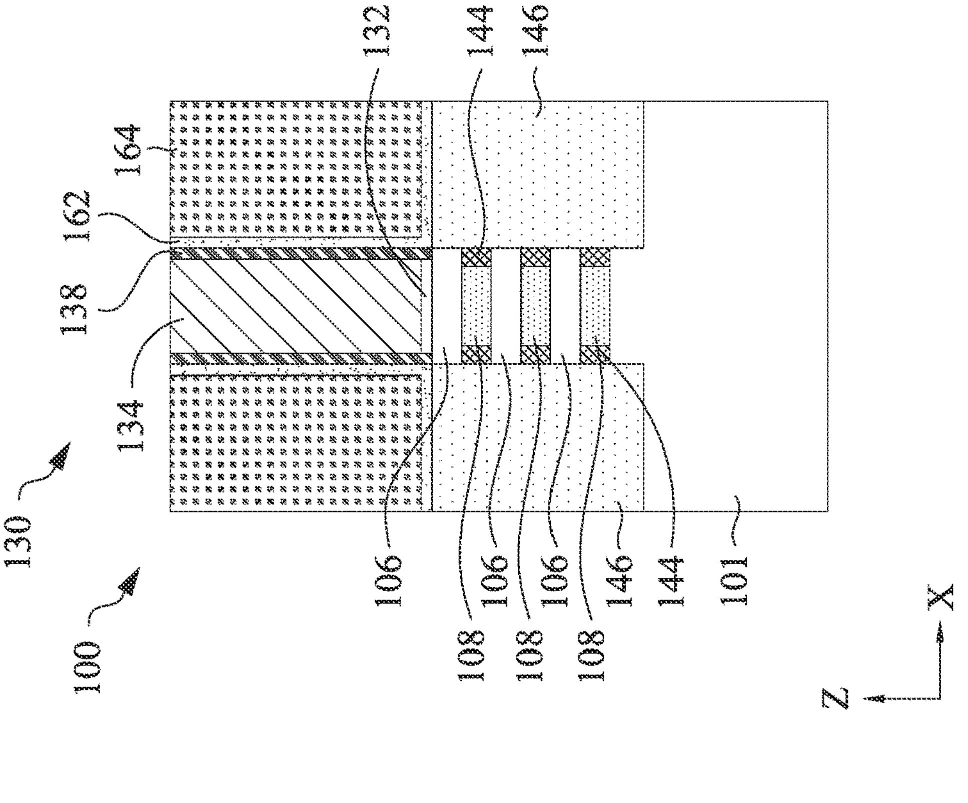
Figure 11C:
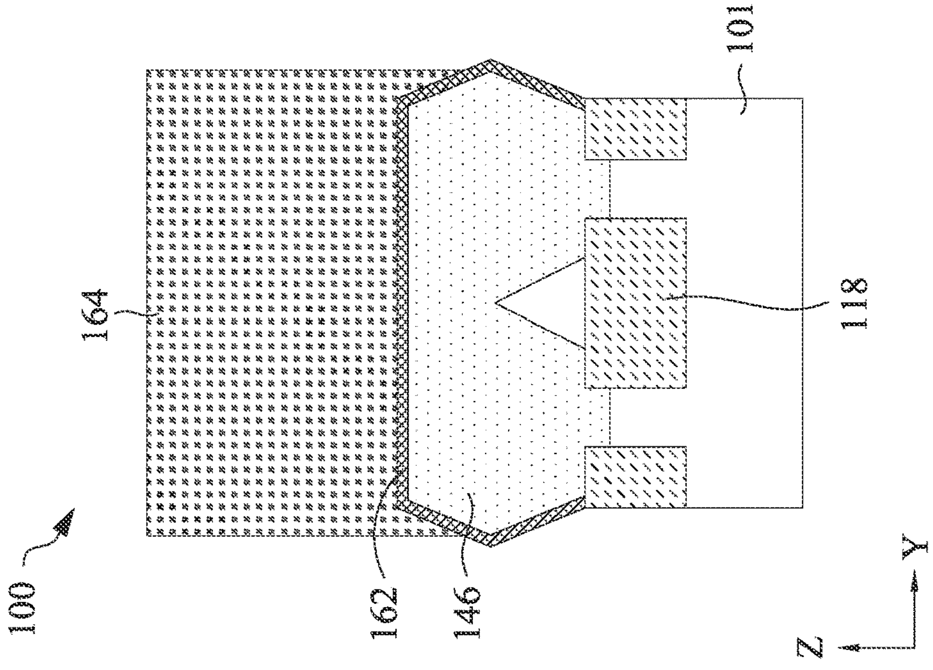

In FIGS. 11A-11C, after the ILD layer 164 is formed, a planarization operation, such as CMP, is performed on the semiconductor device structure 100 until the sacrificial gate electrode layer 134 is exposed.

Figure 12A:
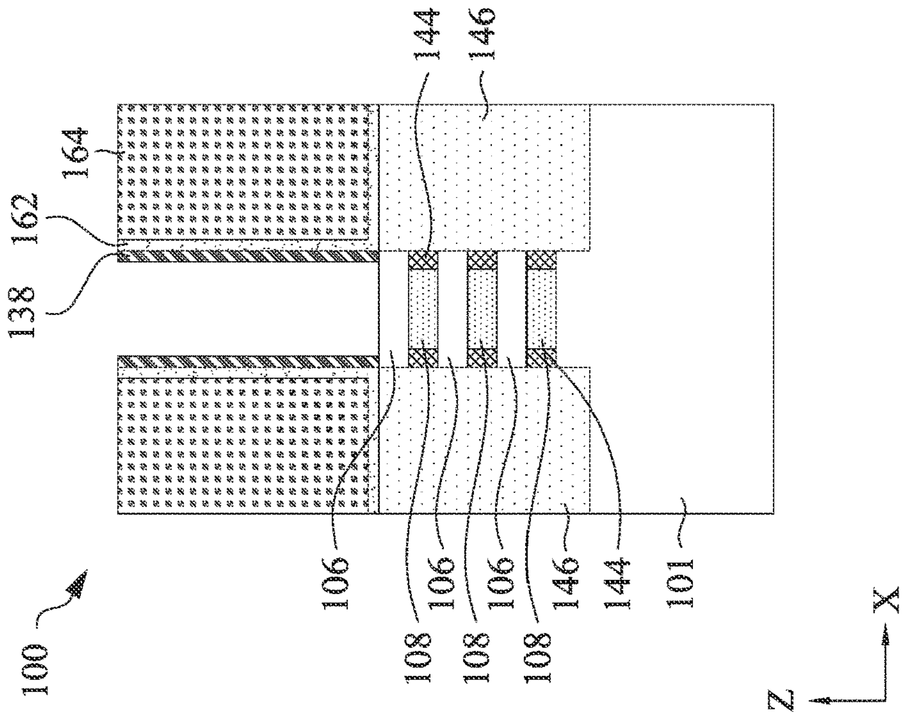
Figure 12B:
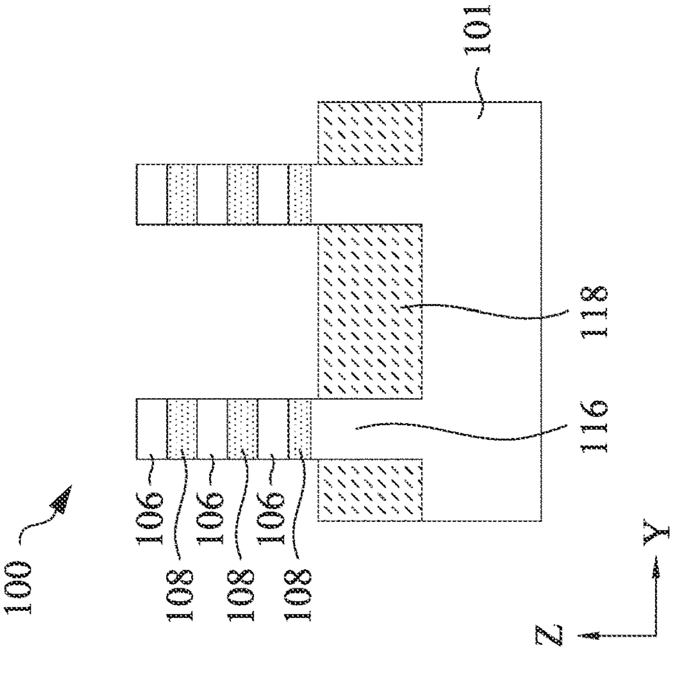
Figure 12C:
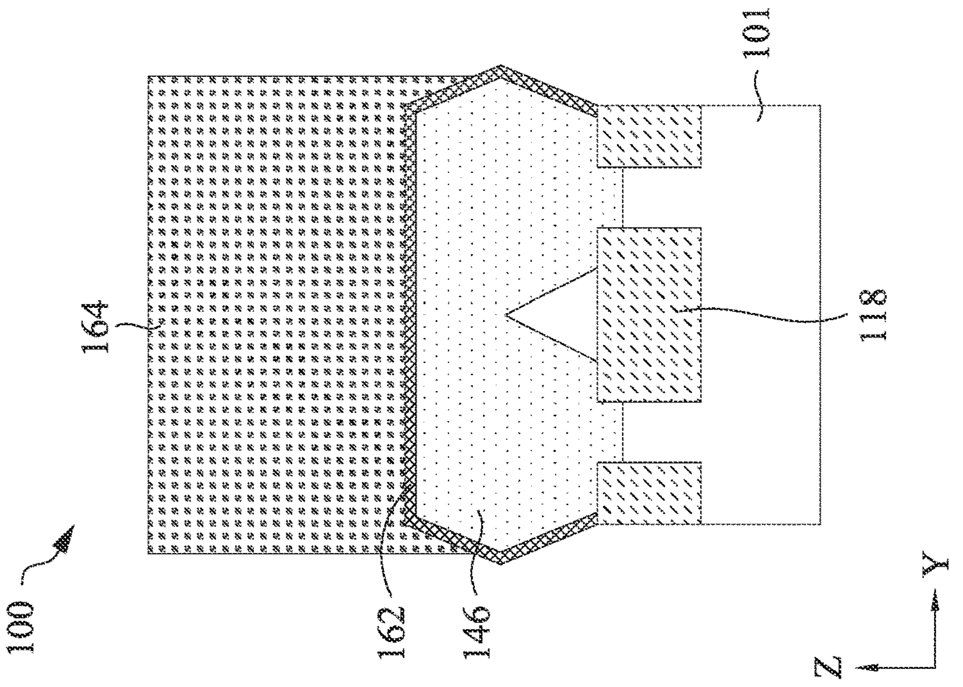

In FIGS. 12A-12C, the sacrificial gate structure 130 is removed. The ILD layer 164 protects the epitaxial S/D features 146 during the removal of the sacrificial gate structure 130. The sacrificial gate structure 130 can be removed using plasma dry etching and/or wet etching. For example, in cases where the sacrificial gate electrode layer 134 is polysilicon and the ILD layer 164 is silicon oxide, a wet etchant such as a tetramethylammonium hydroxide (TMAH) solution can be used to selectively remove the sacrificial gate electrode layer 134 without removing the dielectric materials of the ILD layer 164, the CESL 162, and the gate spacers 138. The sacrificial gate dielectric layer 132 is thereafter removed using plasma dry etching and/or wet etching. The removal of the sacrificial gate structure 130 (i.e., the sacrificial gate electrode layer 134 and the sacrificial gate dielectric layer 132) forms a trench 166 in the regions where the sacrificial gate electrode layer 134 and the sacrificial gate dielectric layer 132 were removed. The trench 166 exposes the top and sides of the stack of semiconductor layers 104 (e.g., the first semiconductor layers 106 and the second semiconductor layers 108).

Figure 13A:
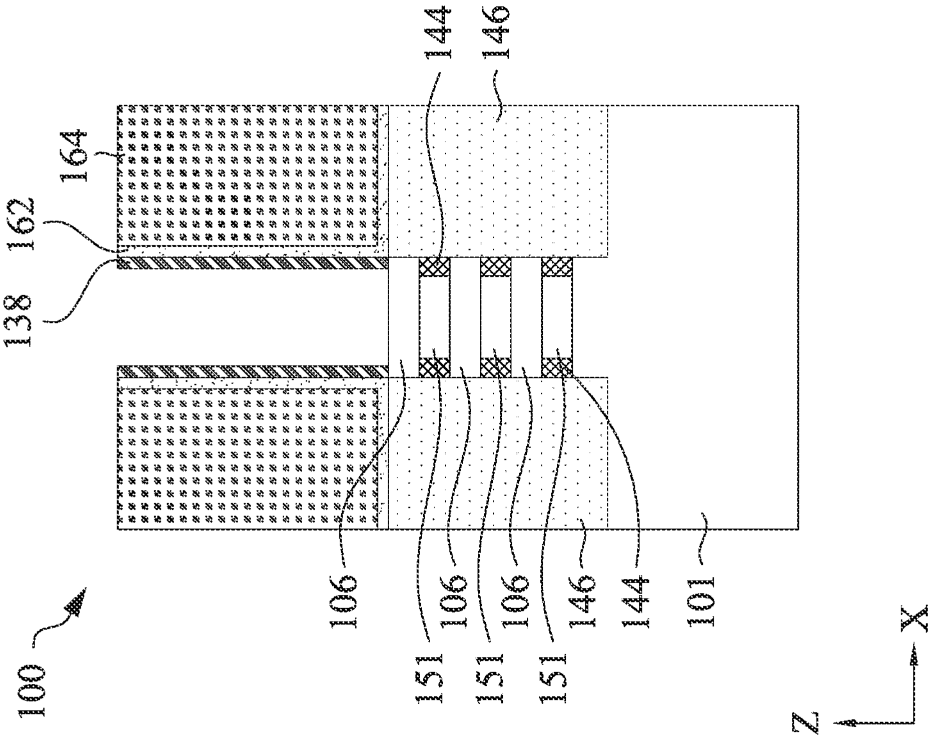
Figure 13B:
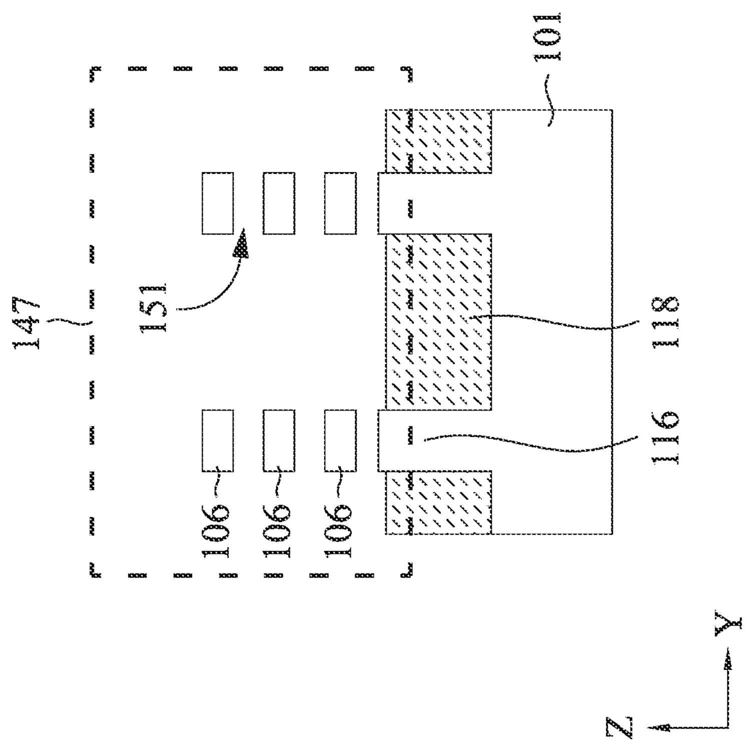
Figure 13C:
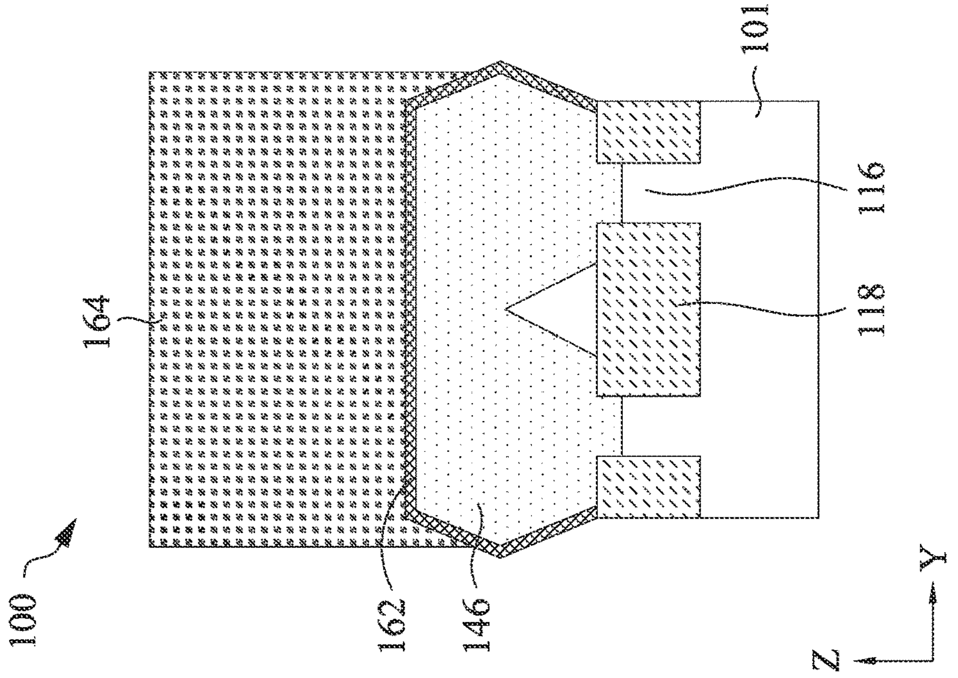

In FIGS. 13A-13C, the exposed second semiconductor layers 108 are removed. The removal of the second semiconductor layers 108 exposes the dielectric spacers 144 and the first semiconductor layers 106. In some embodiments, a small amount (e.g., about 1 nm to about 2.5 nm in terms of thickness) of the first semiconductor layer 106 may be removed during the removal of the second semiconductor layers 108. The removal process may be any suitable etch processes, such as dry etch, wet etch, or a combination thereof. The etch process may be a selective etch process that removes the second semiconductor layers 108 but not the gate spacers 138, the CESL 162, the ILD layer 164, and the first semiconductor layers 106. As a result, openings 151 are formed around the first semiconductor layers 106, and the portion of the first semiconductor layers 106 not covered by the dielectric spacers 144 is exposed to the openings 151.

Figure 14:
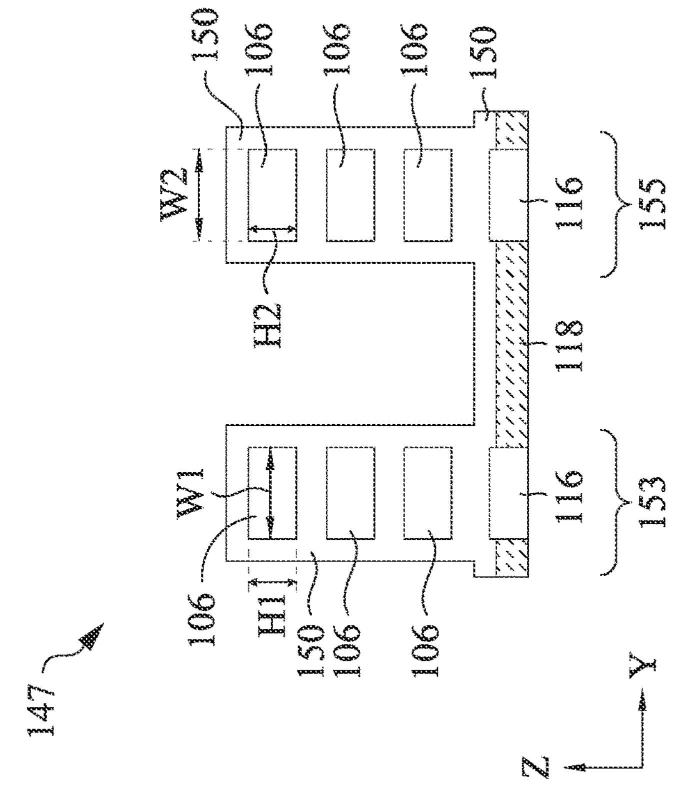
FIGS. 14-24 are cross-sectional side views of various stages of manufacturing the semiconductor device structure taken along line B-B of FIG. 6, in accordance with some embodiments.

FIGS. 14-24 are cross-sectional side views of various stages of manufacturing the semiconductor device structure 100 taken along line B-B of FIG. 6, in accordance with some embodiments. FIGS. 14-24 also illustrate a portion 147 of the semiconductor device structure 100 of FIG. 13B during various stages of manufacturing. The substrate 101 has a first region 153 and a second region 155. In some embodiments, the first region 153 is an n-type region and is forming n-type devices, such as NMOS transistors, e.g., n-type field effect transistors (FETs) (NFETs), and the second region 155 is a p-type region and is for forming p-type devices, such as PMOS transistors, e.g., p-type FETs (PFETs). Although one first region 153 and one second region 155 are illustrated, the substrate 101 can include any desired quantity of such regions. As shown in FIG. 14, the first semiconductor layer 106 in the first region 153 has a height H1 and a width W1, and the first semiconductor layer 106 in the second region 155 has a height H2 and a width W2. In some embodiments, the height H1 is substantially the same as the height H2, and the width W1 is substantially the same as the width W2.

As shown in FIG. 14, a mask layer 150 is formed to surround the exposed surfaces of the first semiconductor layers 106 (i.e., nanosheet channels) and on the well portion 116 of the substrate 101. The mask layer 150 may be also formed on the ILD layer 164 (FIGS. 13A-13C). The mask layer 150 may include any suitable material having different etch selectivity compared to the first semiconductor layers 106. In some embodiments, the mask layer 150 includes a dielectric material, such as $SiO_x$, $AlO_x$, or $SiON_x$. The mask layer 150 is formed by a conformal process, such as an ALD process. As shown in FIG. 14, in some embodiments, the mask layer 150 fills the openings 151 around the first semiconductor layers 106 in order to prevent the subsequently formed photoresist 154 (FIG. 15) from forming in the openings 151, which may be difficult to remove.

Figure 15:
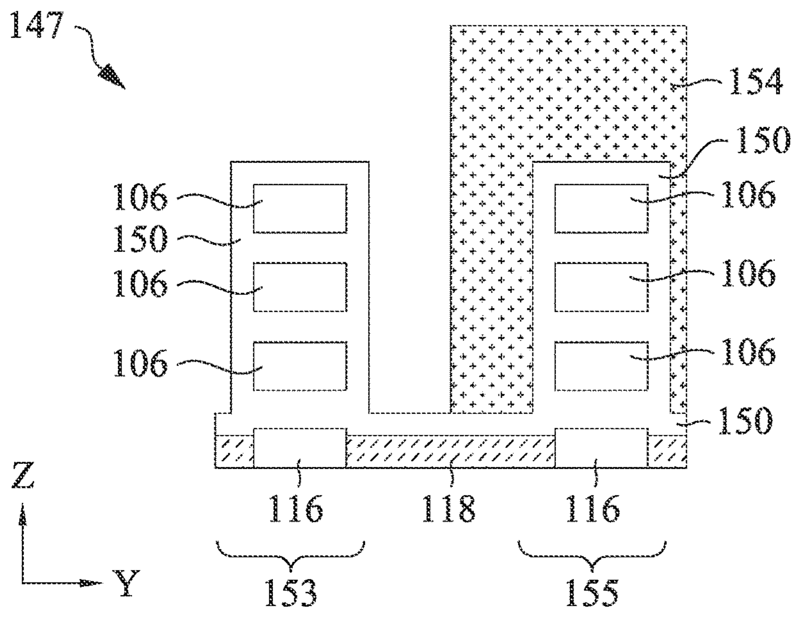
Figure 16:
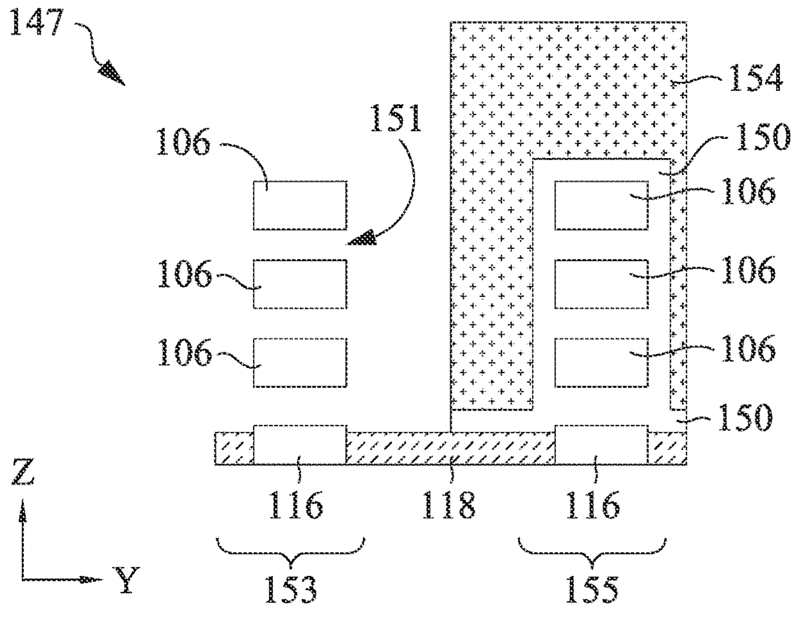
Figure 17:
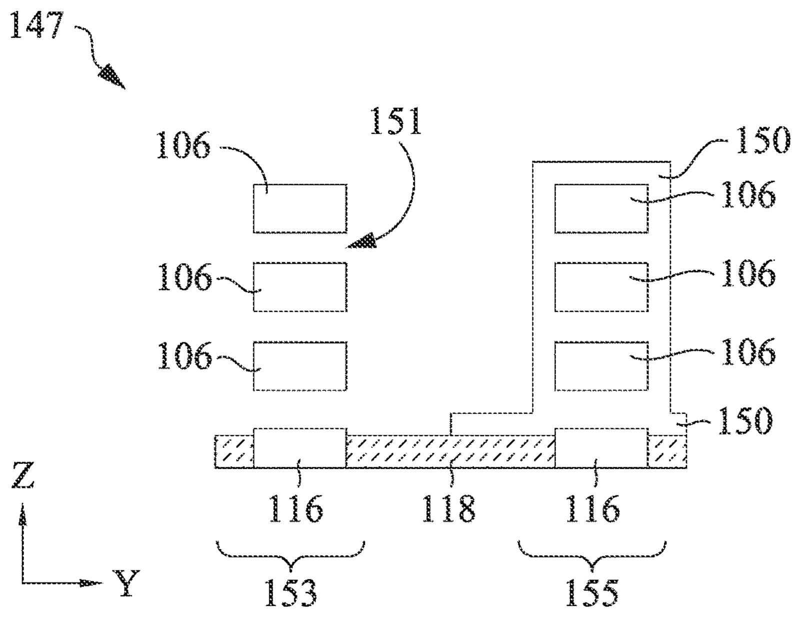

As shown in FIG. 15, the photoresist 154 is formed to cover the portion of the mask layer 150 formed around the first semiconductor layers 106 in the second region 155. Next, the exposed portion of the mask layer 150 is removed, as shown in FIG. 16. The exposed portion of the mask layer 150 may be removed by any suitable process. In some embodiments, a selective etching process is performed to remove the exposed portion of the mask layer 150. The selective etching process may be a dry etching process or a wet etching process and does not substantially affect the photoresist 154 and the first semiconductor layers 106. In some embodiments, in order to completely remove the exposed portion of the mask layer 150, the selective etching process may be performed for an extended period of time, and the dimensions of the first semiconductor layers 106 in the first region 153 may be reduced by the selective etching process. After the removal of the exposed portion of the mask layer 150, the photoresist 154 is removed, as shown in FIG. 17. The photoresist 154 may be removed by any suitable process. In some embodiments, the photoresist 154 may be removed by an ashing process that does not substantially affect the first semiconductor layers 106 and the mask layer 150.

Figure 18:
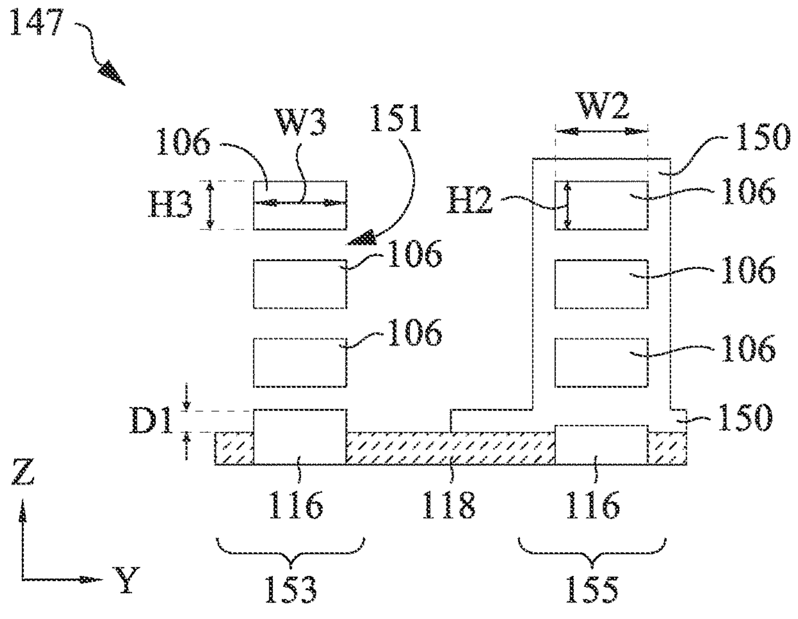

Next, as shown in FIG. 18, the dimensions of the first semiconductor layers 106 in the first region 153 are enlarged. In some embodiments, the dimensions are enlarged by an epitaxy process or a thermal process. For example, a semiconductor material is epitaxially grown from the first semiconductor layers 106 in the first region 153. In some embodiments, the semiconductor material is the same as the material of the first semiconductor layers 106 located in the first region 153. For example, the first semiconductor layers 106 in the first region 153 includes silicon, and silicon is epitaxially grown from the first semiconductor layers 106 in the n-type region. The precursor in the epitaxy process may include a silicon-containing precursor, such as silane, disilane, or other suitable precursors. In other words, a semiconductor material layer is formed to surround the exposed portion of each first semiconductor layer 106 located in the first region 153. As a result, in some embodiments, each of the first semiconductor layers 106 in the first region 153 has a height H3 and a width W3. The height H3 of the first semiconductor layer 106 in the first region 153 is substantially greater than the height H2 of the first semiconductor layer 106 in the second region 155, and the width W3 of the first semiconductor layer 106 in the first region 153 is substantially greater than the height W2 of the first semiconductor layer 106 in the second region 155. The semiconductor material may be also grown on the well portion 116 in the first region 153. Thus, in some embodiments, a distance D1 between a top surface of the well portion 116 in the first region 153 and a top surface of the insulating material 118 is substantially greater than a distance D2 between a top surface of the well portion 116 in the second region 155 and the top surface of the insulating material 118. The process to enlarge the dimensions of the first semiconductor layers 106 and the well portion 116 located in the first region 153 is a selective process, so the semiconductor material is not formed on the mask layer 150.

Figure 19:
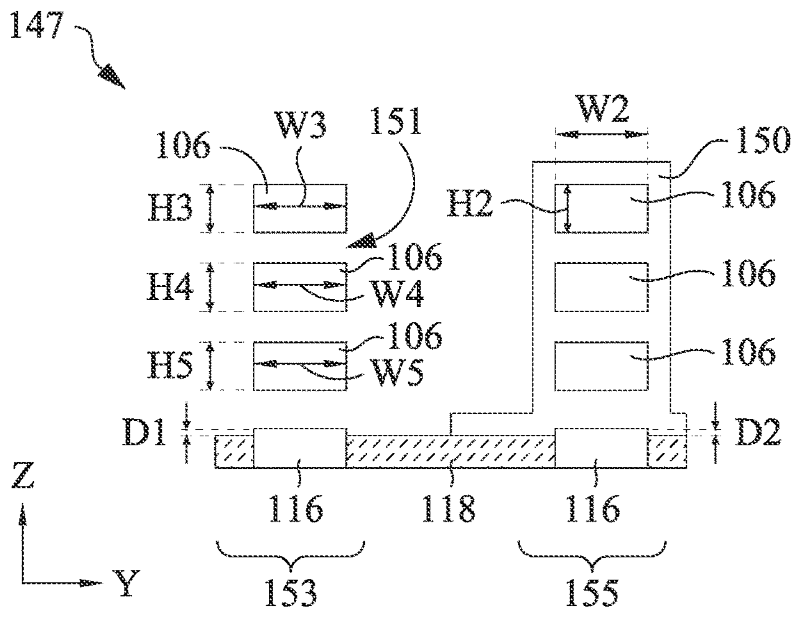

As shown in FIG. 18, in some embodiments, the dimensions of each first semiconductor layer 106 in the first region 153 are increased by a substantially the same amount. As a result, each first semiconductor layer 106 in the first region 153 has the width W3 and the height H3. In some embodiments, the dimensions of each first semiconductor layer 106 in the first region 153 are increased by different amounts, as shown in FIG. 19. For example, a deposition process, such as an epitaxial deposition process, is performed to form the semiconductor material layer on the exposed surfaces of the first semiconductor layer 106 in the first region 153. During the deposition process, the top first semiconductor layers 106 in the first region 153 are exposed to the precursors before the bottom first semiconductor layers 106 in the first region 153. As a result of the deposition process, the topmost first semiconductor layer 106 in the first region 153 has the height H3 and the width W3, the middle first semiconductor layer 106 has the height H4 and the width W4, and the bottom first semiconductor layer 106 has the height H5 and the width W5. In some embodiments, the height H3 is substantially greater than the height H4, which is substantially greater than the height H5, and the width W3 is substantially greater than the width W4, which is substantially greater than the width W5. In other words, the height and width of the first semiconductor layer 106 in the first region 153 decrease in a direction towards the well portion 116. In some embodiments, the width W5 and the height H5 are substantially greater than the width W2 and the height H2. In some embodiments, a small amount or no semiconductor material is formed on the well portion 116 in the first region 153, and the distance D1 may be substantially the same as the distance D2, as shown in FIG. 19.

As shown in FIGS. 18 and 19, the first semiconductor layers 106 in the first region 153 have dimensions substantially greater than the dimensions of the first semiconductor layers 106 in the second region 155. Thus, the dimensions of the channels in the first region 153 are substantially greater than the dimensions of the channels in the second region 155. In some embodiments, the first region 153 is an n-type region, and the second region 155 is a p-type region. As a result, the on-current for the NFET in the first region 153 may be substantially greater than the on-current for the PFET in the second region 155. In some embodiments, the first region 153 is a p-type region, and the second region 155 is an n-type region. As a result, the on-current for the PFET in the first region 153 may be substantially greater than the on-current for the NFET in the second region 155. By making the dimensions of the channels of the NFET and PFET to be different, the performance of the device having the NFET and PFET is improved.

Figure 20:
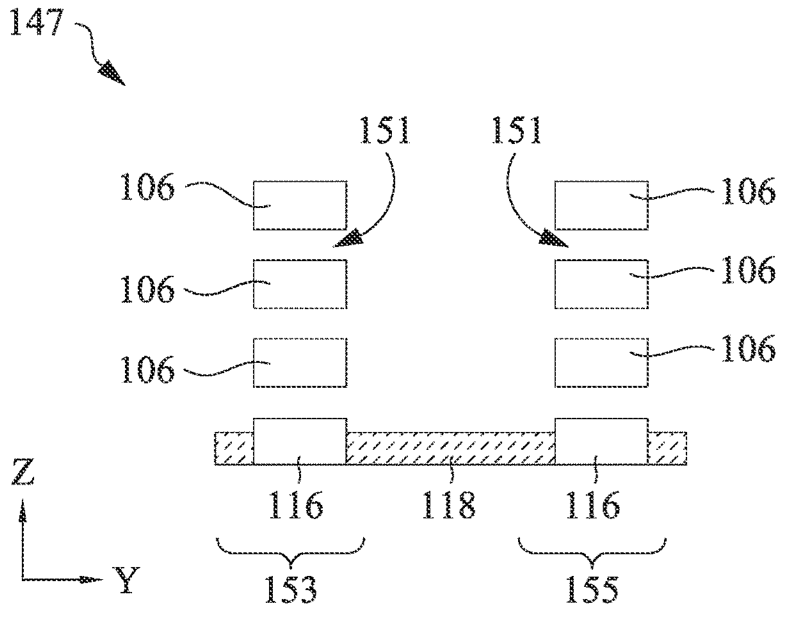

Next, as shown in FIG. 20, the mask layer 150 in the second region 155 is removed. The mask layer 150 may be removed by any suitable process. In some embodiments, the mask layer 150 is removed by the same process to remove the portion of the mask layer 150 in the first region 153, as described in FIG. 16. In some embodiments, the removal of the mask layer 150 may remove portions of the first semiconductor layers 106 in both first region 153 and second region 155, and a second deposition process is performed to compensate for the damages on the first semiconductor layers 106 in the first region 153 and the second region 155 by the process to remove the mask layer 150. For example, after the removal of the mask layer 150, the height and width of the first semiconductor layers 106 in the first region 153 are less than the height H3 and the width W3 (or less than the heights H3, H4, H5 and the widths W3, W4, W5), and the second deposition process forms a semiconductor material layer around the first semiconductor layers 106 so the first semiconductor layers 106 in the first region 153 has the height H3 and the width W3 (or the heights H3, H4, H5 and the width W3, W4, W5). Similarly, after the removal of the mask layer 150, the height and width of the first semiconductor layers 106 in the second region 155 are less than the height H2 and the width W2, and the second deposition process forms a semiconductor material layer around the first semiconductor layers 106 so the first semiconductor layers 106 in the second region 155 has the height H2 and the width W2. The semiconductor material layer formed by the second deposition process may include the same material as the first semiconductor layers 106. In some embodiments, the semiconductor material layer includes undoped silicon.

Figure 21:
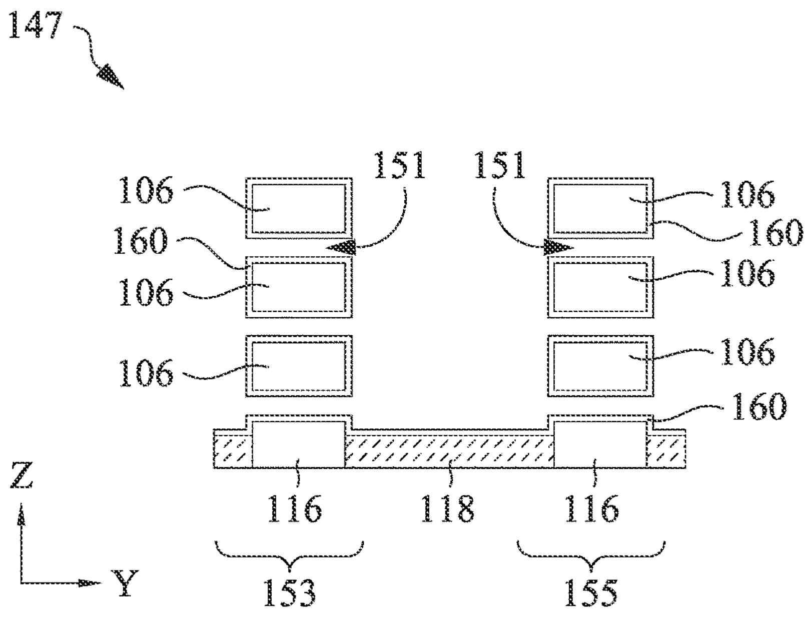

As shown in FIG. 21, a gate dielectric layer 160 is formed on the exposed surfaces of the semiconductor device structure 100. In some embodiments, the HK dielectric layer 160 is formed to wrap around the first semiconductor layers 106 and over the well portions 116 in the regions 153, 155. The gate dielectric layer 160 is also formed on the insulating material 118. The gate dielectric layer 160 may include or made of a high-K dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k dielectric materials. The gate dielectric layer 160 may be a conformal layer formed by a conformal process, such as an ALD process or a CVD process. The gate dielectric layer 160 may have a thickness ranging from about 0.5 nm to about 3 nm.

In some embodiments, an interfacial layer (IL) (not shown) may be formed on the first semiconductor layers 106 and the well portions 116, and the gate dielectric layer 160 is formed on the IL. The IL may include or be made of an oxygen-containing material, such as silicon oxide, silicon oxynitride, oxynitride, etc. In one embodiment, the IL is silicon oxide.

Figure 22:
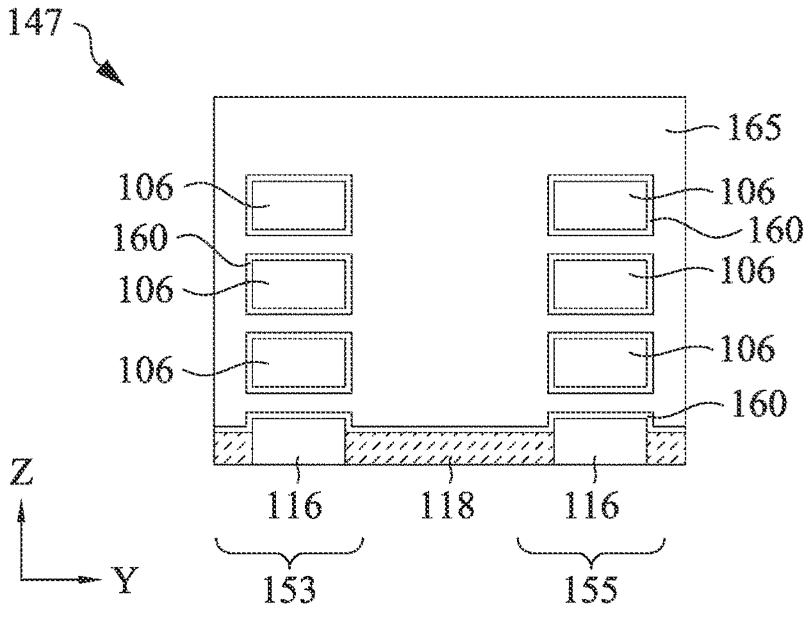

As shown in FIG. 22, a first gate electrode layer 165 is formed on the gate dielectric layer 160. The first gate electrode layer 165 fills the opening 151 (FIG. 21) and surrounds a portion of each first semiconductor layer 106 in the region 153, 155. In some embodiments, the first gate electrode layer 165 may be formed using multiple layers, each layer deposited sequentially adjacent to each other using a highly conformal deposition process such as ALD. Other deposition technique such as PVD, CVD, or electroplating may also be used. While not shown, the first gate electrode layer 165 may include one or more work function layers and a fill material. The work function layers may be formed from a metal-containing material such as W, Cu, AlCu, TiAlC, TiAlN, Ti, TiN, Ta, TaN, Co, Ni, Ag, Al, TaAl, TaAlC, TaC, TaCN, TaSiN, Mn, Zr, other suitable work function materials, or combinations thereof. Once the work function layers are formed, the fill material is deposited to fill a remainder of the opening 151. The fill material may be an electrically conductive material, such as W, Al, Cu, AlCu, W, Ti, TiAlN, TaC, TaCN, TaSiN, Mn, Zr, TiN, Ta, TaN, Co, Ni, combinations of these, or the like.

Figure 23:
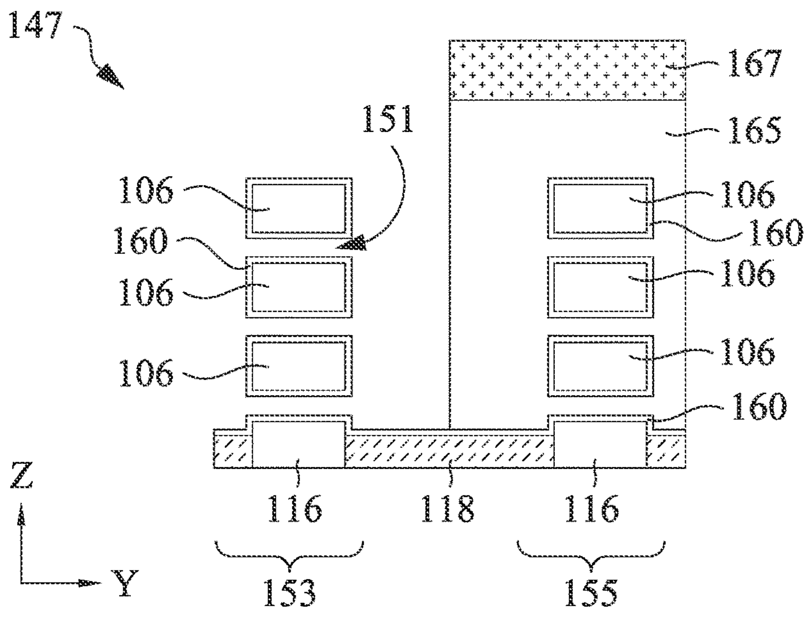

As shown in FIG. 23, a portion of the first gate electrode layer 165 in the first region 153 is removed. A patterned resist layer 167 may be first formed to cover the portion of the first gate electrode layer 165 located in the second region 155, while the portion of the first gate electrode layer 165 located in the first region 153 is exposed. The patterned resist layer 167 may be formed by first forming a blanket layer on the semiconductor device structure 100, followed by patterning and etching processes to remove portions of the blanket layer at selected regions to form the patterned resist layer 167. Once the patterned resist layer 167 is formed, the portion of the first gate electrode layer 165 over the first semiconductor layers 106 in the first region 153 is removed. The first gate electrode layer 165 may be removed using any suitable processes, such as dry etch, wet etch, or a combination thereof. The removal process may be a selective etch process that removes the first gate electrode layer 165 but not the gate dielectric layer 160.

Figure 24:
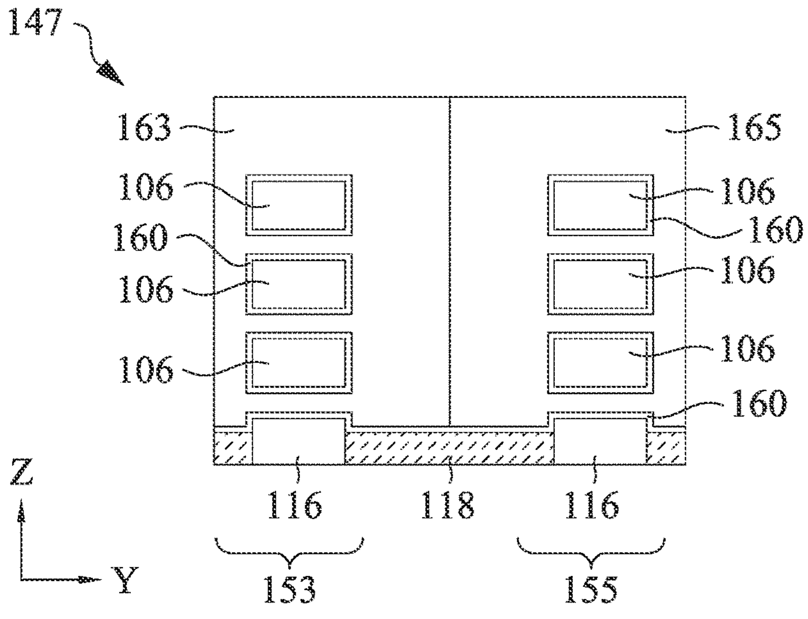

Next, as shown in FIG. 24, a second gate electrode layer 163 is formed on the gate dielectric layer 160 in the first region 153. The second gate electrode layer 163 may be deposited to surround the first semiconductor layers 106 in the first regions 153. The second gate electrode layer 163 may be formed by the same process as the first gate electrode layer 165. The second gate electrode layer 163 may also include one or more work function layers and a fill material, such as those listed for the first gate electrode layer 165. In some embodiments, the second gate electrode layer 163 is chemically different from the first gate electrode layer 165 and include different materials from the first gate electrode layer 165. Each layer in the first and second gate electrode layers 165, 163 may be chosen depending on the threshold voltage and application of the NMOS or PMOS devices in the regions 153, 155.

The second electrode layer 163 may be also formed on the patterned resist layer 167 and the ILD layer 164. A planarization process, such as a CMP process, may be performed to remove the portions of the second electrode layer 163 formed on the patterned resist layer 167 and the ILD layer 164. In some embodiments, the patterned resist layer 167 is also removed by the planarization process.

FIGS. 25A-25D are perspective views of one of the various stages of manufacturing the semiconductor device structure 100 taken along cross-sections A-A, B-B, C-C, and D-D of FIG. 6, in accordance with some embodiments. Cross-section D-D is perpendicular to cross-section C-C and is in a plane of the fin structure 112 along the X direction. Specifically, FIGS. 25A-25D illustrates the stage after the second gate electrode layer 163 is formed in the first regions 153 and the patterned resist layer 167 is removed.

Figure 25A:
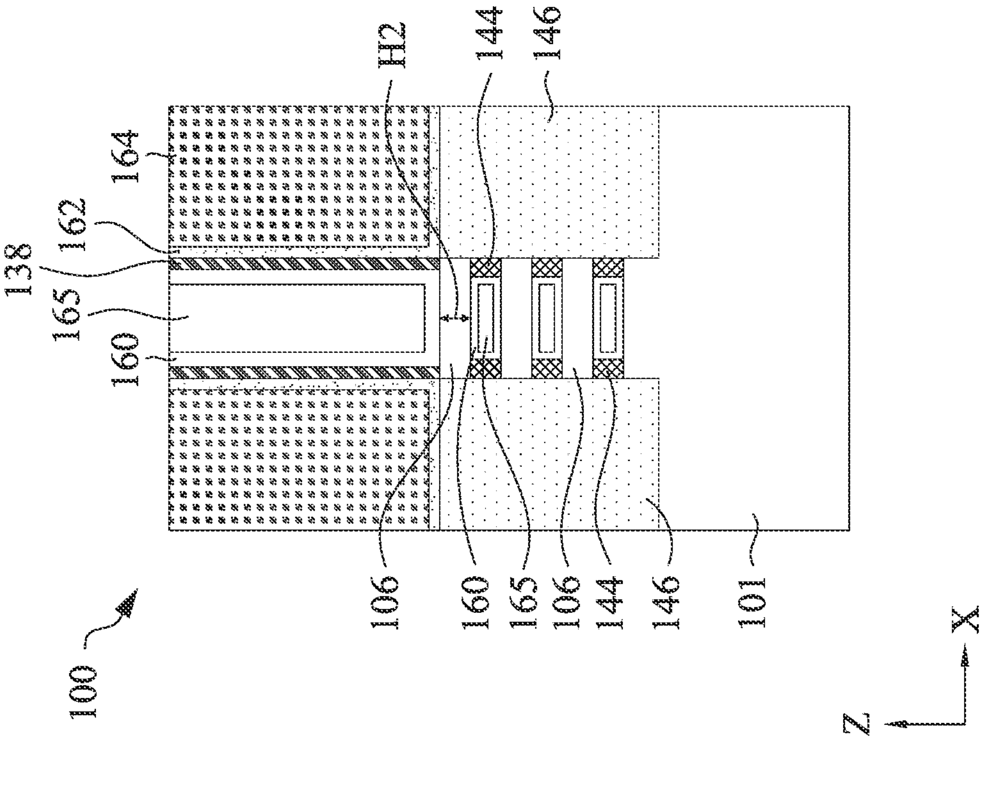
FIGS. 25A-25D are perspective views of one of the various stages of manufacturing the semiconductor device structure taken along cross-sections A-A, B-B, C-C, and D-D of FIG. 6, respectively, in accordance with some embodiments.
Figure 25B:
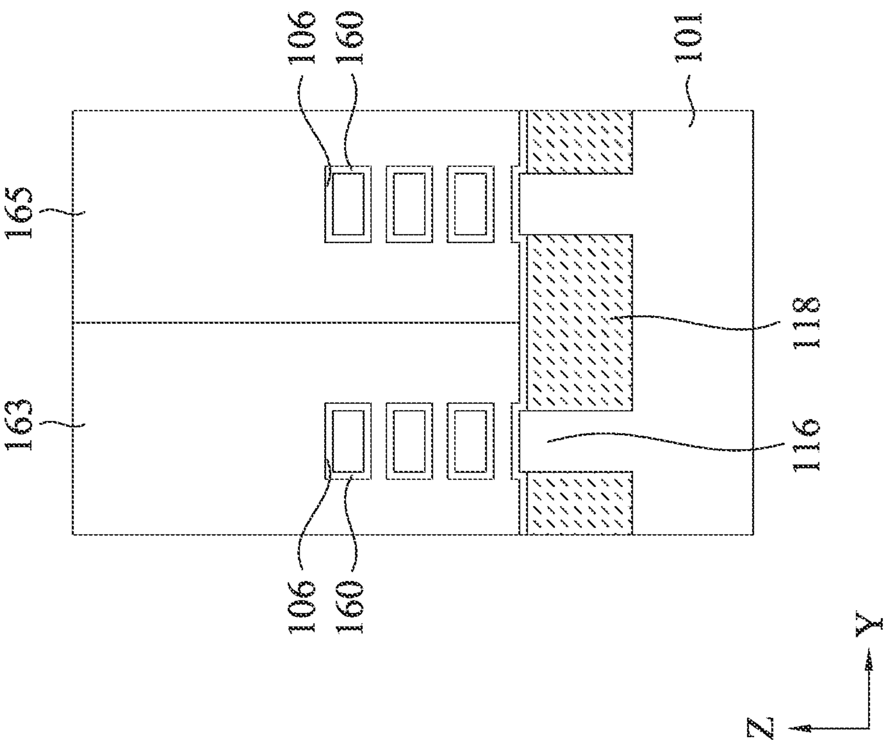
Figure 25D:
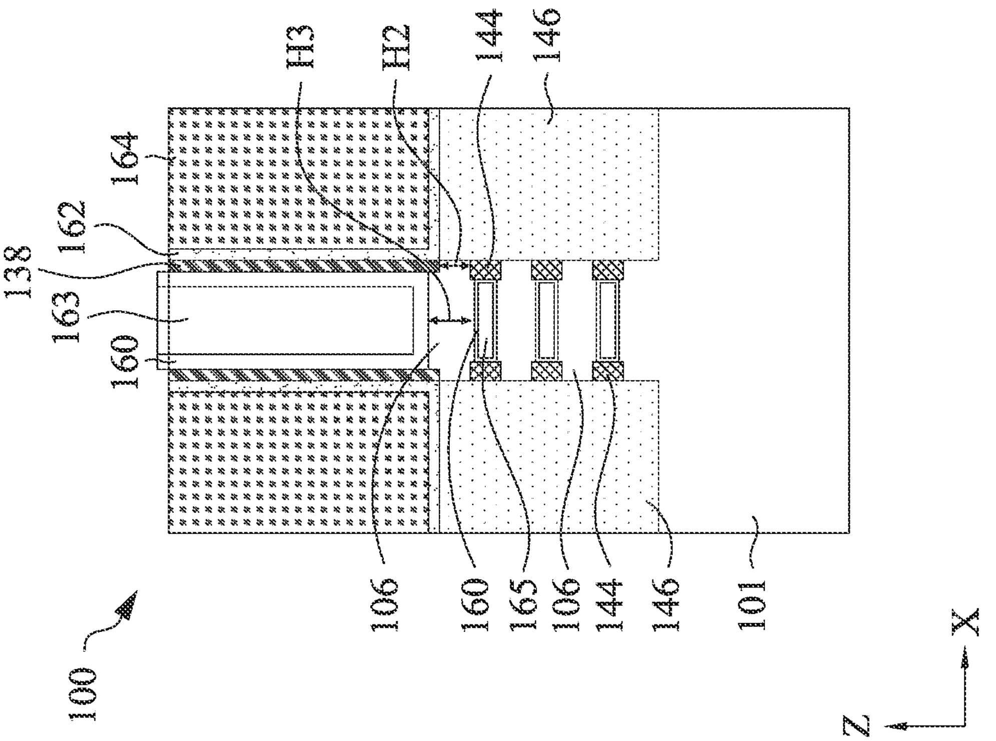
Figure 25C:
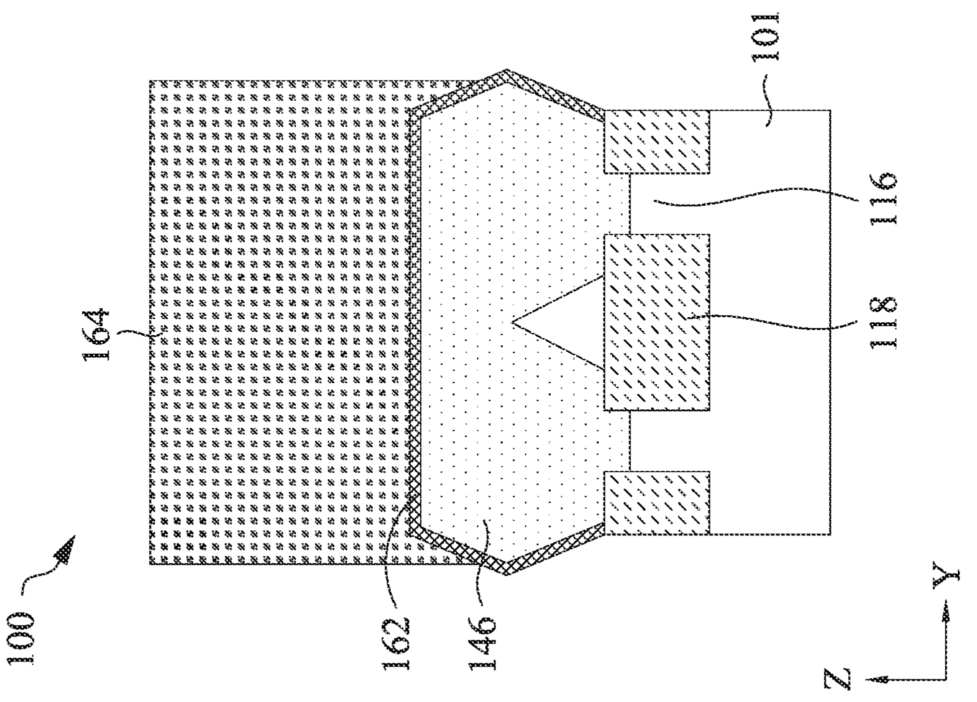

As shown in FIGS. 25A, which illustrates the second region 155, each first semiconductor layer 106 has a substantially constant height H2 in the second region 155. In some embodiments, the height of the center portion (adjacent the gate dielectric layer 160) of each first semiconductor layer 106 in the second region 155 may be substantially smaller than the height of the edge portion (adjacent the dielectric spacers 144) due to the process to remove the second semiconductor layers 108. In contrast, as shown in FIG. 25D, which illustrates the first region 153, each first semiconductor layer 106 in the first region 153 has the edge portion having the height H2 and the center portion having the height H3 (or heights H4, H5) substantially greater than the height H2. The height of the center portion of the first semiconductor layer 106 in the first region 153 is substantially greater than the height of the edge portion of the first semiconductor layer 106 in the first region 153 as a result of the processes described in FIGS. 18 and 19. The edge portions of the first semiconductor layers 106 in the first region 153 are covered by the dielectric spacers 144, and the semiconductor material layer is not formed on the edge portions of the first semiconductor layers 106 in the first region 153.

It is understood that the semiconductor device structure 100 may undergo further complementary metal oxide semiconductor (CMOS) and/or back-end-of-line (BEOL) processes to form various features such as contacts/vias, interconnect metal layers, dielectric layers, passivation layers, etc.

Figure 26:
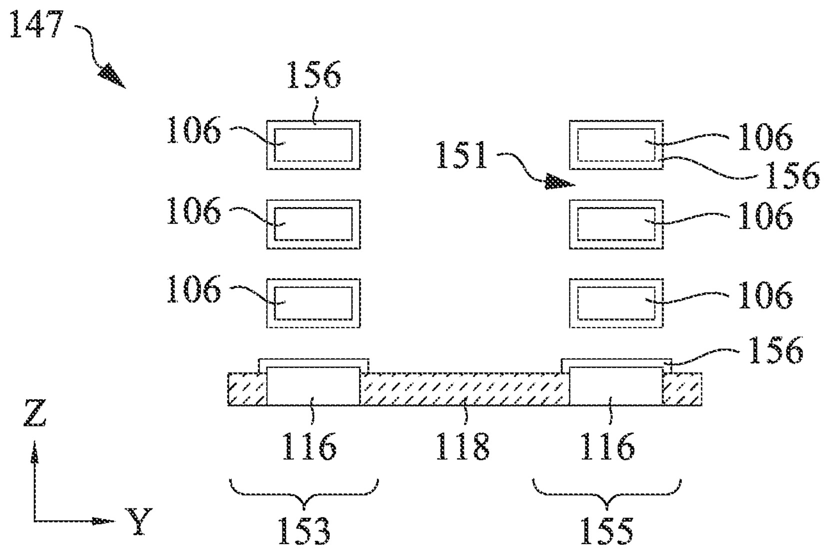
FIGS. 26-34 are cross-sectional side views of various stages of manufacturing the semiconductor device structure taken along line B-B of FIG. 6, in accordance with alternative embodiments.

FIGS. 26-34 are cross-sectional side views of various stages of manufacturing the semiconductor device structure taken along line B-B of FIG. 6, in accordance with alternative embodiments. FIGS. 26-34 also illustrate the portion 147 of the semiconductor device structure 100 of FIG. 13B during various stages of manufacturing. As shown in FIG. 26, after the processes described in FIGS. 13A-13C, the IL 156 is formed to surround the exposed portions of the first semiconductor layers 106 in the first and second regions 153, 155. The IL 156 may be also formed on the well portions 116. The IL 156 may be selectively formed on the semiconductor materials of the first semiconductor layers 106 and the well portions 116. At this stage, the dimensions of the first semiconductor layers 106 in the first region 153 and the dimensions of the first semiconductor layers 106 in the second region 155 may be substantially the same.

Figure 27:
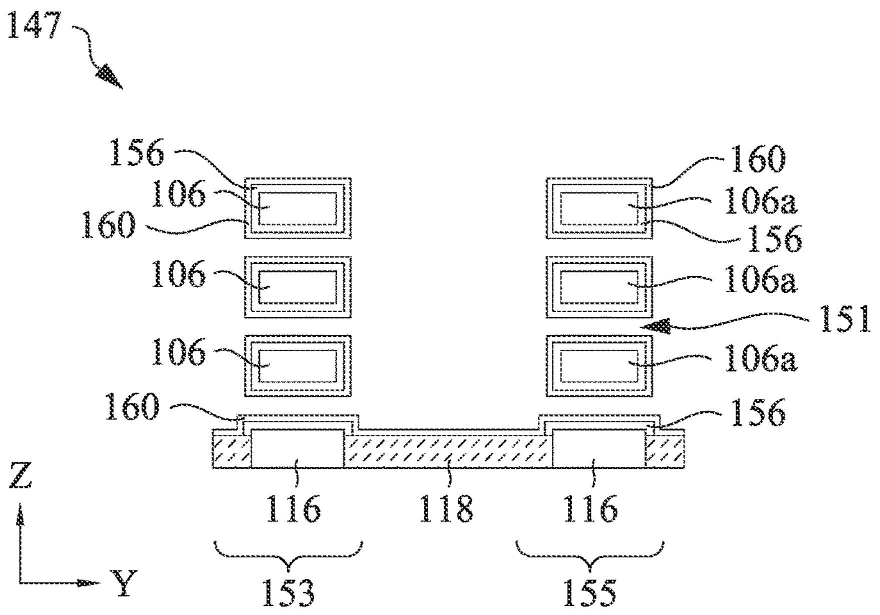
Figure 28:
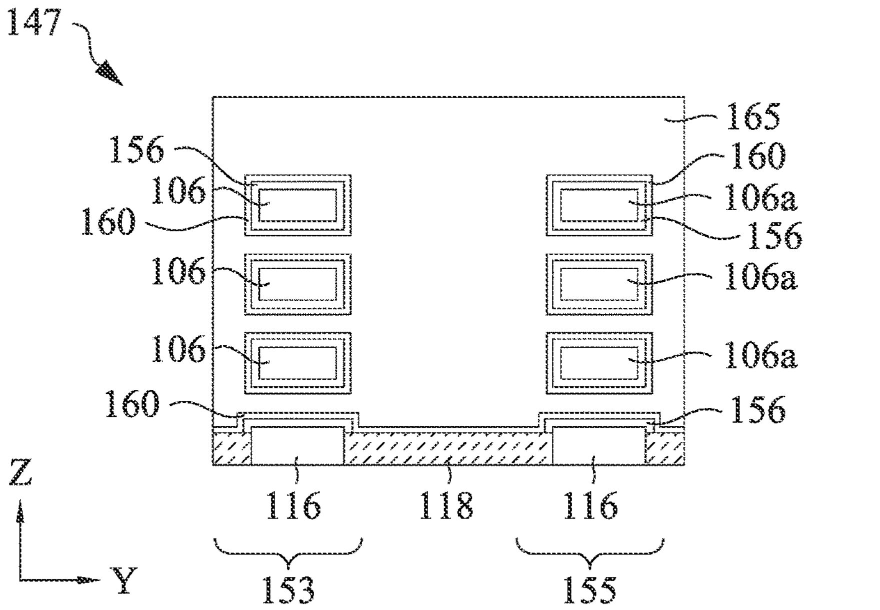
Figure 29:
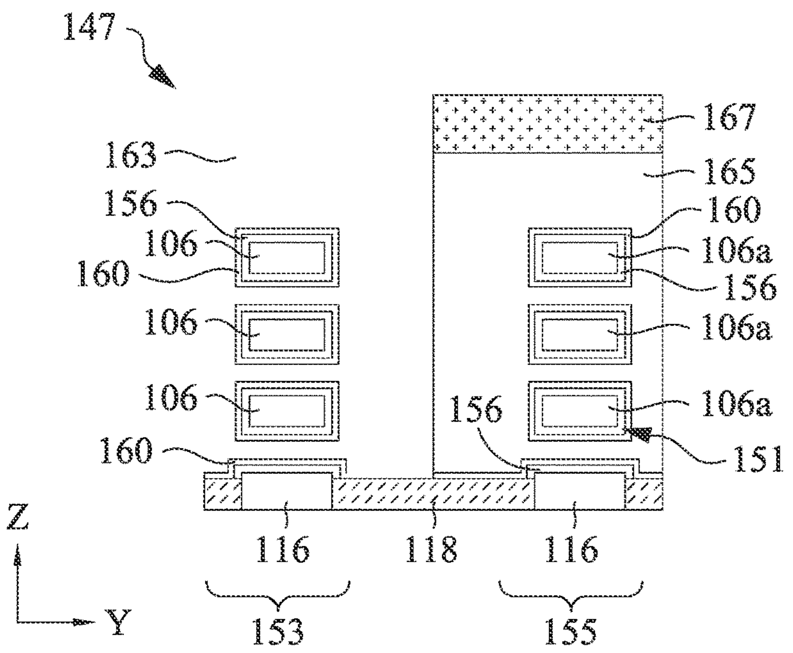
Figure 30:
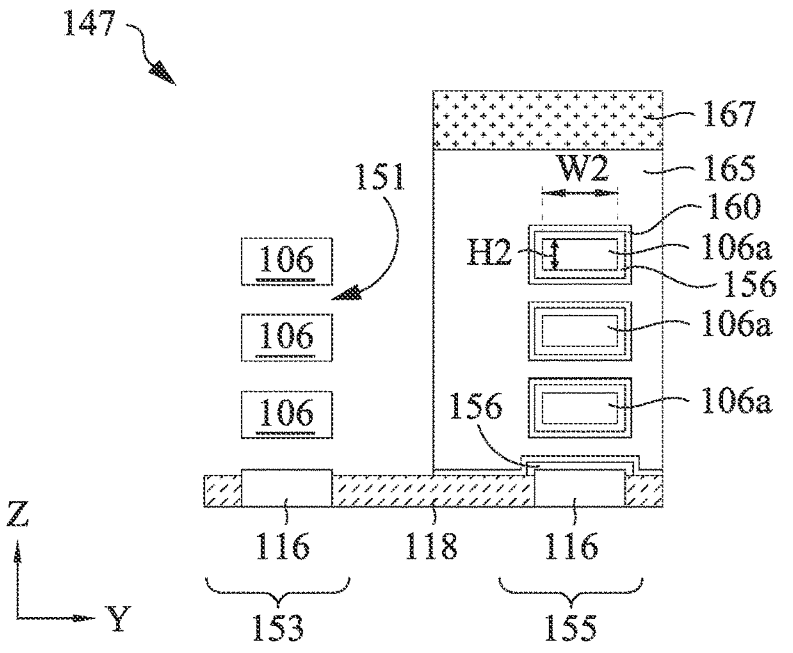

Next, as shown in FIG. 27, the gate dielectric layer 160 is formed on the IL 156 and the insulation material 118. The first gate electrode layer 165 is then formed on the gate dielectric layer 160 in the first and second regions 153, 155, as shown in FIG. 28. The patterned resist layer 167 is then formed on the portion of the first gate electrode layer 165 in the second region 155, and the exposed portion of the first gate electrode layer 165 in the first region 153 is removed, as shown in FIG. 29. The process to remove the portion of the first gate electrode layer 165 may be the same as the process described in FIG. 23. Next, the exposed portions of the gate dielectric layer 160 and the portions of the IL 156 in the first region 153 are removed, as shown in FIG. 30. The portions of the gate dielectric layer 160 and IL 156 may be removed by any suitable process, such as a dry etch, a wet etch, or a combination thereof. In some embodiments, the portions of the gate dielectric layer 160 and IL 156 are removed by a selective etch process that does not substantially affect the patterned resist layer 167, the first gate electrode layer 165, and the first semiconductor layers 106. After the removal process, the first semiconductor layers 106 located in the first region 153 not covered by the dielectric spacers 144 are exposed.

Figure 31:
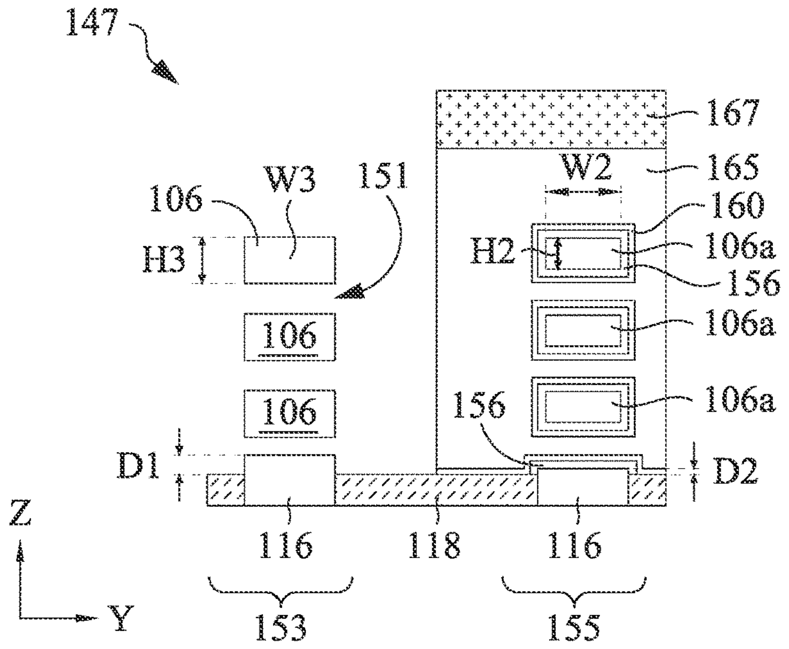

Next, as shown in FIG. 31, the dimensions of the exposed first semiconductor layers 106 in the first region 153 are increased. The process to increase the dimensions of the first semiconductor layers 106 in the first region 153 may be the same as the process described in FIG. 18. As a result, each of the first semiconductor layers 106 in the first region 153 has the height H3 and the width W3, and each of the first semiconductor layers 106 in the second region 155 has the height H2 substantially less than the height H3 and the width W2 substantially less than the width W3. In addition, the distance D1 between the top surface of the well portion 116 in the first region 153 and the top surface of the insulating material 118 is substantially greater than the distance D2 between the top surface of the well portion 116 in the second region 155 and the top surface of the insulating material 118.

Figure 32:
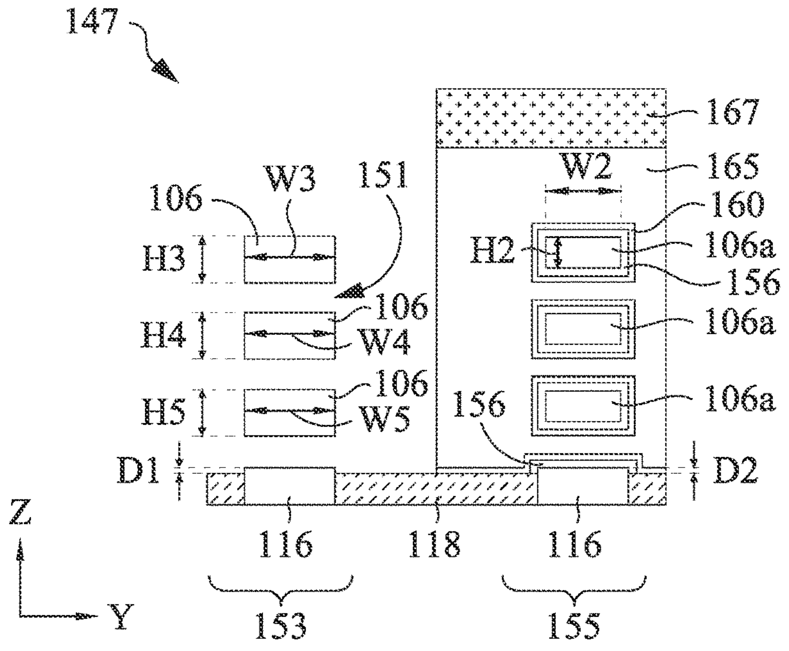

Alternatively, as shown in FIG. 32, topmost first semiconductor layer 106 in the first region 153 has the height H3 and the width W3, the middle first semiconductor layer 106 has the height H4 and the width W4, and the bottom first semiconductor layer 106 has the height H5 and the width W5. In some embodiments, the height H3 is substantially greater than the height H4, which is substantially greater than the height H5, and the width W3 is substantially greater than the width W4, which is substantially greater than the width W5. In other words, the height and width of the first semiconductor layer 106 in the first region 153 decrease in a direction towards the well portion 116. In some embodiments, the width W5 and the height H5 are substantially greater than the width W2 and the height H2. In some embodiments, the distance D1 may be substantially the same as the distance D2, as shown in FIG. 32.

Figure 33:
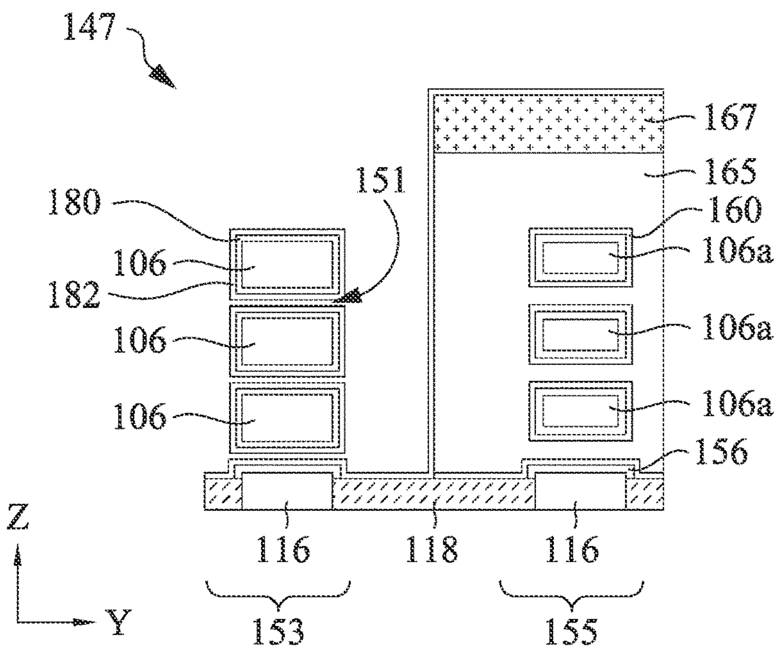

Next, as shown in FIG. 33, an IL 180 is formed to surround the exposed portions of the first semiconductor layers 106 in the first region 153, and a gate dielectric layer 182 is formed on the IL 180 and the exposed portions of the insulating material 118. The IL 180 may include the same material as the IL 156 and may be formed by the same process as the IL 156. The gate dielectric layer 182 may include the same material as the gate dielectric layer 160 and may be formed by the same process as the gate dielectric layer 160. In some embodiments, the gate dielectric layer 182 and the gate dielectric layer 160 include different materials. In some embodiments, the gate dielectric layer 182 is formed by a conformal process, such as ALD. The gate dielectric layer 182 may be also formed on the sidewall of the first gate electrode layer 165 and the patterned resist layer 167, as shown in FIG. 33.

Figure 34:
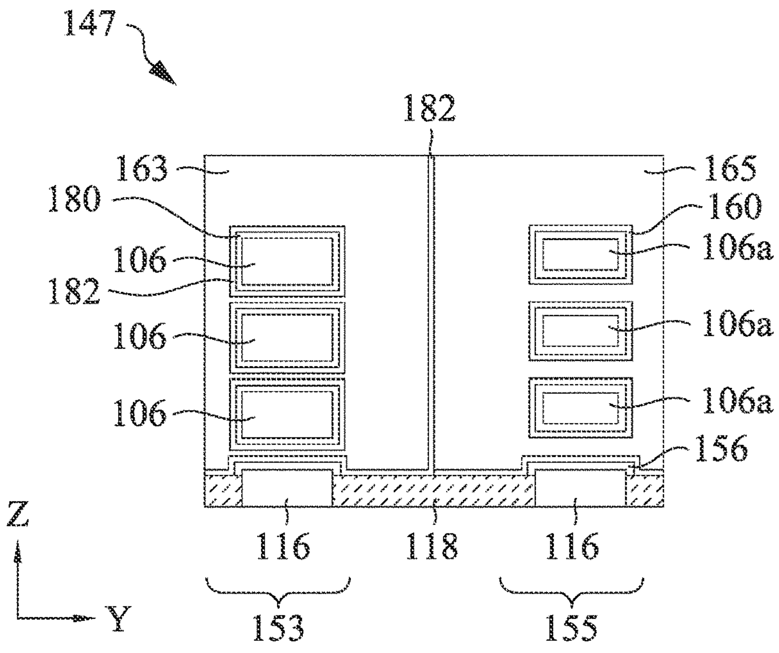

Next, as shown in FIG. 34, the second gate electrode layer 163 is formed on the dielectric layer 182 to surround the first semiconductor layers 106 in the first region 153. The planarization process is then performed to remove the portions of the second gate electrode layer 163, a portion of the gate dielectric layer 182, and the patterned resist layer 167. The resulting structure may be substantially the same as the structure shown in FIG. 24, with the exception of a portion of the gate dielectric layer 182 is disposed between the first gate electrode layer 163 and the second gate electrode layer 165. Thus, in some embodiments, each of the first and second gate electrode layers 165, 163 has its own conductive contact for providing power thereto.

Figure 35:
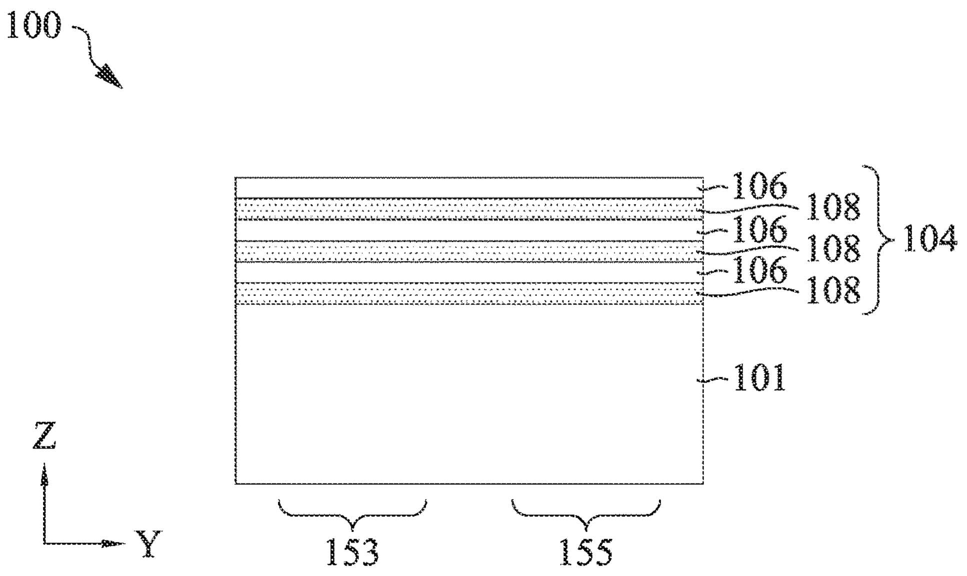
FIGS. 35-40 are cross-sectional side views of various stages of manufacturing the semiconductor device structure taken along line B-B of FIG. 6, in accordance with alternative embodiments.

FIGS. 35-40 are cross-sectional side views of various stages of manufacturing the semiconductor device structure taken along line B-B of FIG. 6, in accordance with alternative embodiments. As shown in FIG. 35, the stack of semiconductor layers 104 are formed on the substrate 101. The semiconductor device structure 100 shown in FIG. 35 may be the same as the semiconductor device structure 100 shown in FIG. 1.

Figure 36:
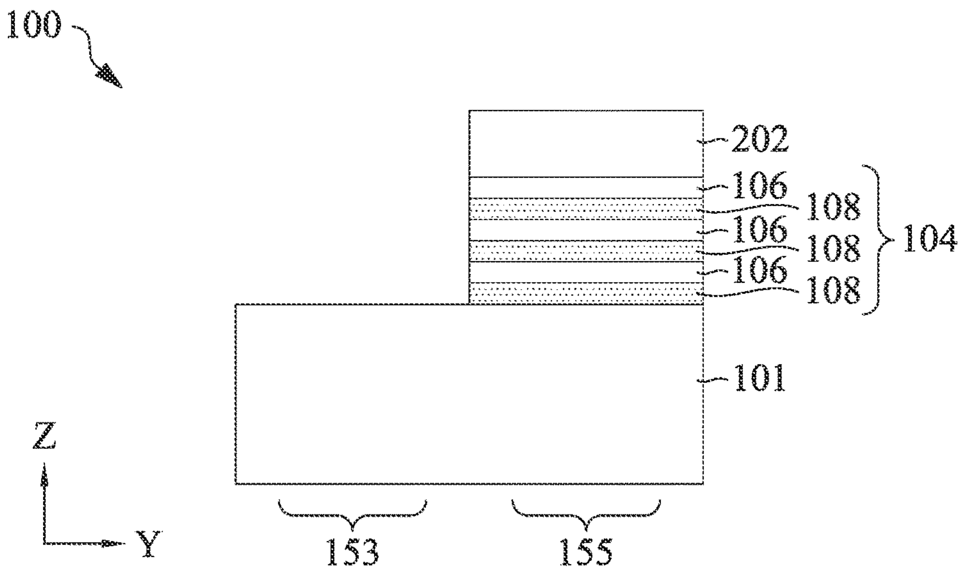

Next, as shown in FIG. 36, a patterned mask layer 202 is formed on a portion of the stack of semiconductor layers 104 in the second region 155, and the exposed portion of the stack of semiconductor layers 104 in the first region 153 is removed to expose a portion of the substrate 101. The removal of the portion of the stack of semiconductor layers 104 may be performed by any suitable process. In some embodiments, the process to form the fin structures 112 as described in FIG. 2 is performed to remove the portion of the stack of semiconductor layers 104. In some embodiments, the exposed portion of the substrate 101 in the first region 153 has a top surface that is substantially co-planar with a top surface of the portion of the substrate 101 in the second region 155, as shown in FIG. 36. In some embodiments, the top surface of the substrate 101 in the first region 153 is located at a level below the top surface of the substrate 101 in the second region 155 as a result of over etching.

Figure 37:
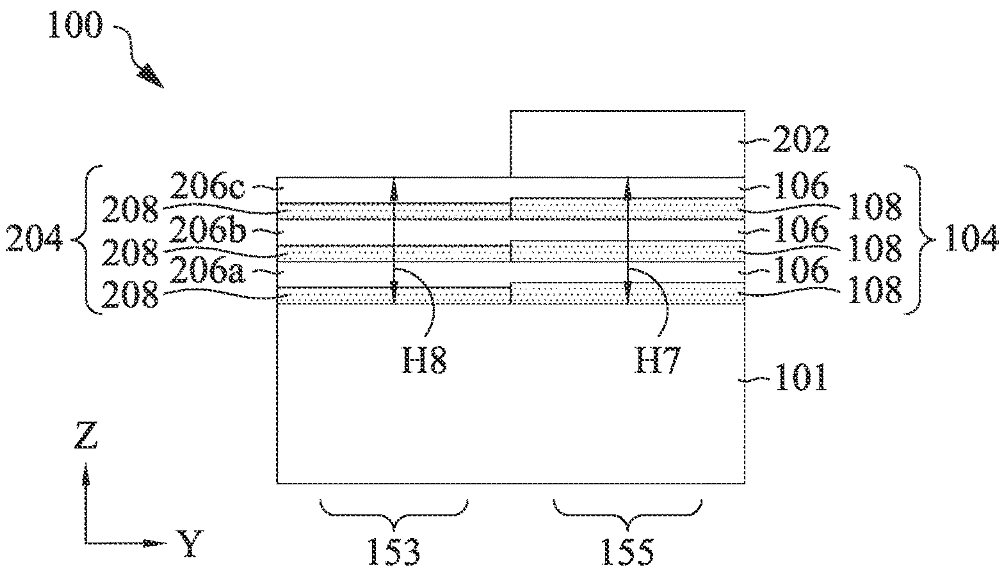

As shown in FIG. 37, a stack of semiconductor layers 204 are formed on the exposed portion of the substrate 101. In some embodiments, the stack of semiconductor layers 204 includes alternating first and second semiconductor layers 206 (206*a*, 206*b*, 206*c*), 208. The first semiconductor layers 206 may include the same material as the first semiconductor layers 106, and the second semiconductor layers 208 may include the same material as the second semiconductor layer 108. In some embodiments, the height of the second semiconductor layer 208 is substantially less than the height of the second semiconductor layer 108, and the height of the first semiconductor layer 206 is substantially greater than the height of the first semiconductor layer 106. In some embodiments, the stack of semiconductor layers 104 has a height H7, the stack of semiconductor layers 204 has a height H8, and the height H8 is substantially greater than the height H7.

Figure 38:
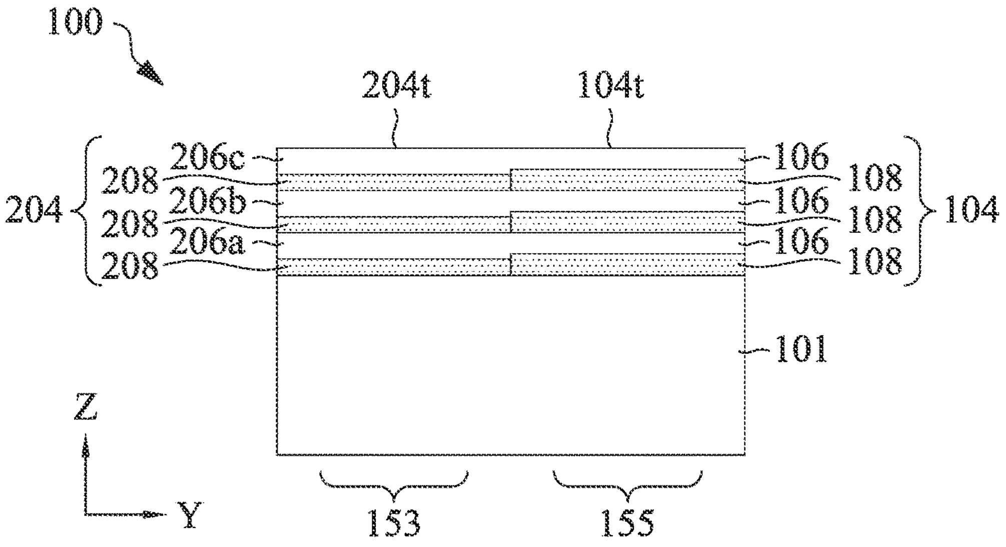

As shown in FIG. 38, the patterned mask layer 202 is removed, and a top surface 104*t* of the stack of semiconductor layers 104 in the second region 155 and a top surface 204*t* of the stack of semiconductor layers 204 in the first region 153 may be substantially co-planar. In some embodiments, a planarization process, such as a CMP process, is performed to planarize the semiconductor device structure 100. The planarization process removes a portion of the topmost first semiconductor layer 206*c*. As a result, in some embodiments, the height of the topmost first semiconductor layer 206*c* is less than the height of the other first semiconductor layers 206*a*, 206*b* in the stack of semiconductor layers 204. The height of the topmost first semiconductor layer 206*c* may be greater than, equal to, or less than the height of the first semiconductor layers 106 of the stack of semiconductor layers 104 in the second region 155.

Figure 39:
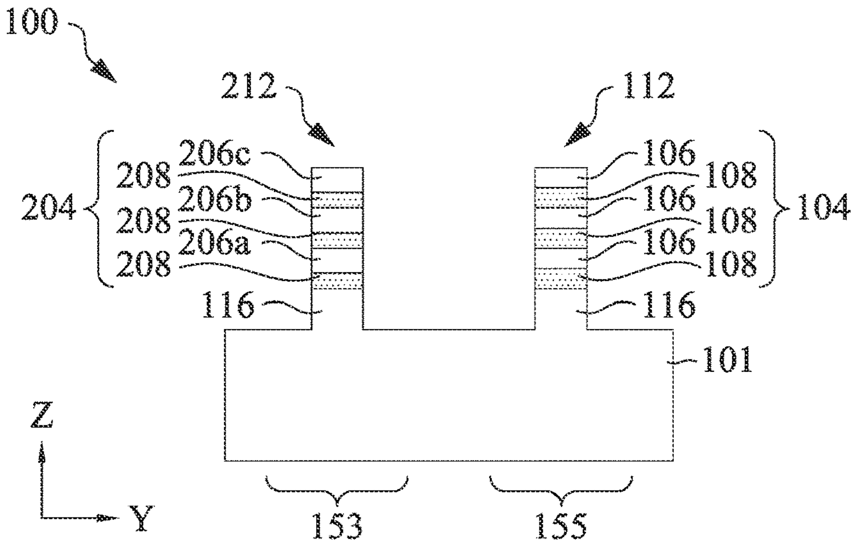

As shown in FIG. 39, fin structures 212, 112 are formed in the first and second regions 153, 155, respectively. The fin structures 212, 112 may be formed by the same process as the process to form the fin structures 112 as described in FIG. 2. In some embodiments, the widths of the fin structures 212, 112 in the Y direction are substantially the same. In some embodiments, the width of the fin structure 212 is substantially greater than the width of the fin structure 112.

Subsequent processes, such as the processes described in FIG. 3 to FIGS. 13C and FIG. 26 to FIGS. 28, are performed. After the process performed in FIG. 28, a portion of the first gate electrode layer 165 in the first region 153 is removed, and the second gate electrode layer 163 is formed in the first region 153, as shown in FIG. 40.

Figure 40:
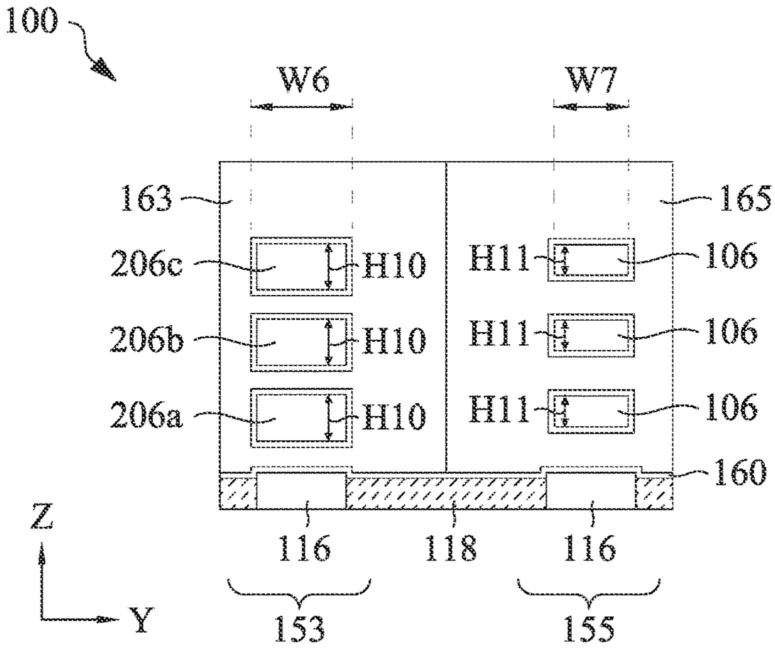

As shown in FIG. 40, each first semiconductor layer 106 in the second region 155 has a height H11 and a width W7. Each first semiconductor layer 206*a*, 206*b*, 206*c* has a width W6. In some embodiments, the widths W6, W7 may be substantially the same. In some embodiments, the width W6 is substantially greater than the width W7. The widths W6 and W7 are defined by the widths of the fin structures 212, 112, respectively. The topmost first semiconductor layer 206*c* in the first region 153 has a height H10, and the other first semiconductor layers 206*b*, 206*a* in the first region 153 has a height H9. In some embodiments, the height H10 is substantially less than the height H9, as a result of the planarization process described in FIG. 38. The height H10 may be smaller than, greater than, or equal to the height H11. The IL 156 is omitted in FIG. 40 for clarity.

Embodiments of the present disclosure provide a semiconductor device structure 100 and methods to form the same. In some embodiments, the semiconductor device structure 100 includes a first plurality of semiconductor layers 106 located in a first region 153 of a substrate 101 and a second plurality of semiconductor layers 106 located in a second region 155 of the substrate 101. The dimensions of the first plurality of semiconductor layers 106 located in the first region 153 may be substantially greater than the dimensions of the second plurality of semiconductor layers 106 located in the second region 155. Some embodiments may achieve advantages. For example, by making the dimensions of the channels of the NFET and PFET to be different, the performance of the device having the NFET and PFET is improved.

An embodiment is a semiconductor device structure. The structure includes a first semiconductor layer disposed over a substrate, the first semiconductor layer has an edge portion and a center portion, and a height of the center portion is substantially greater than a height of the edge portion. The structure further includes a dielectric spacer disposed below and in contact with the edge portion of the first semiconductor layer, a gate dielectric layer surrounding the center portion of the first semiconductor layer, and a gate electrode layer disposed on the gate dielectric layer surrounding the center portion of the first semiconductor layer.

Another embodiment is a semiconductor device structure. The structure includes a first plurality of semiconductor layers disposed in a first region of a substrate, and a bottom semiconductor layer of the first plurality of semiconductor layers has a first height. The structure further includes a second plurality of semiconductor layers disposed in a second region of the substrate, and heights of the semiconductor layers of the second plurality of semiconductor layers are substantially less than the first height. The structure further includes a first gate electrode layer surrounding portions of the first plurality of semiconductor layers and a second gate electrode layer surrounding portions of the second plurality of semiconductor layers.

A further embodiment is a method for forming a semiconductor device structure. The method includes forming first and second fin structures, the first fin structure includes a first plurality of semiconductor layers, and the second fin structure includes a second plurality of semiconductor layers. The method further includes forming a mask layer surrounding the second plurality of semiconductor layers, and the first plurality of semiconductor layers are exposed. The method further includes increasing dimensions of each semiconductor layers of the first plurality of semiconductor layers, removing the mask layer, depositing a gate dielectric layer surrounding the first and second pluralities of semiconductor layers, forming a first gate electrode layer surrounding the second plurality of semiconductor layers, and forming a second gate electrode layer surrounding the first plurality of semiconductor layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:

forming first and second fin structures, wherein the first fin structure comprises a first plurality of semiconductor layers, and the second fin structure comprises a second plurality of semiconductor layers;

forming a mask layer surrounding the second plurality of semiconductor layers, wherein the first plurality of semiconductor layer are exposed;

increasing dimensions of each semiconductor layer of the first plurality of semiconductor layers;

removing the mask layer;

depositing a gate dielectric layer surrounding the first and second pluralities of semiconductor layers;

forming a first gate electrode layer surrounding the second plurality of semiconductor layers; and forming a second gate electrode layer surrounding the first plurality of semiconductor layers.

2. The method of claim 1, further comprising increasing the dimensions of each semiconductor layer of the first plurality of semiconductor layers and dimensions of each semiconductor layer of the second plurality of semiconductor layers after removing the mask layer.

3. The method of claim 1, wherein forming the mask layer comprises:

depositing a dielectric layer to surround each semiconductor layer of the first and second pluralities of semiconductor layers;

forming a photoresist over a portion of the dielectric layer surrounding the second plurality of semiconductor layers; and removing a portion of the dielectric layer surrounding the first plurality of semiconductor layers.

4. The method of claim 3, further comprising removing the photoresist after increasing the dimensions of each semiconductor layer of the first plurality of semiconductor layers.

5. The method of claim 1, wherein the dimensions of each semiconductor layer of the first plurality of semiconductor layers are increased by an epitaxial deposition process.

6. The method of claim 1, wherein the first and second gate electrode layers are formed on the gate dielectric layer.

7. The method of claim 6, wherein the first gate electrode layer interfaces the second gate electrode layer.

8. A method, comprising:

forming first and second fin structures, wherein the first fin structure comprises a first semiconductor layer and a second semiconductor layer disposed over the first semiconductor layer, and the second fin structure comprises a third semiconductor layer and a fourth semiconductor layer disposed over the third semiconductor layer;

increasing dimensions of the first and second semiconductor layers without increasing dimensions of the third and fourth semiconductor layers;

depositing a gate dielectric layer surrounding the first, second, third, and fourth semiconductor layers;

forming a first gate electrode layer surrounding the first and second semiconductor layers; and forming a second gate electrode layer surrounding the third and fourth semiconductor layers.

9. The method of claim 8, wherein the dimensions of the first and second semiconductor layers are increased by a same amount.

10. The method of claim 8, wherein the dimensions of the first and second semiconductor layers are increased by different amounts.

11. The method of claim 10, wherein a width of the second semiconductor layer is greater than a width of the first semiconductor layer.

12. The method of claim 11, wherein a height of the second semiconductor layer is greater than a height of the first semiconductor layer.

13. The method of claim 8, wherein the dimensions of the first and second semiconductor layers are increased by an epitaxy process.

14. The method of claim 13, further comprising forming a mask layer on the third and fourth semiconductor layers prior to performing the epitaxy process.

15. The method of claim 14, wherein the mask layer is formed by a conformal process.

16. A method, comprising:

forming first and second fin structures, wherein the first fin structure comprises alternating first and second semiconductor layers, and the second fin structure comprises alternating third and fourth semiconductor layers;

removing the second and fourth semiconductor layers to expose the first and third semiconductor layers;

increasing dimensions of the first semiconductor layer without increasing dimensions of the third semiconductor layer;

depositing a gate dielectric layer surrounding the first and third semiconductor layers;

forming a first gate electrode layer surrounding the first semiconductor layer; and forming a second gate electrode layer surrounding the third semiconductor layer.

17. The method of claim 16, further comprising depositing a sacrificial gate structure around the first and second fin structures.

18. The method of claim 17, further comprising removing the sacrificial gate structure to expose the first, second, third, and fourth semiconductor layers.

19. The method of claim 16, further comprising depositing a mask layer around the first and third semiconductor layers.

20. The method of claim 19, further comprising removing a portion of the mask layer to expose the first semiconductor layer.

* * * * *